US012513824B2

(12) United States Patent
Takase et al.

(10) Patent No.: US 12,513,824 B2
(45) Date of Patent: Dec. 30, 2025

(54) LIGHT-EMITTING MODULE, METHOD OF MANUFACTURING WIRING SUBSTRATE, AND METHOD OF MANUFACTURING LIGHT-EMITTING MODULE

(71) Applicant: NICHIA CORPORATION, Anan (JP)

(72) Inventors: Shota Takase, Tokushima (JP);
Masanori Uemura, Anan (JP);
Masakazu Sakamoto, Tokushima (JP);
Yosuke Noda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 203 days.

(21) Appl. No.: 18/465,803

(22) Filed: Sep. 12, 2023

(65) Prior Publication Data
US 2024/0098901 A1 Mar. 21, 2024

(30) Foreign Application Priority Data
Sep. 16, 2022 (JP) .................................. 2022-147830

(51) Int. Cl.
*H05K 1/02* (2006.01)
*H05K 1/11* (2006.01)
(Continued)

(52) U.S. Cl.
CPC ............. *H05K 1/181* (2013.01); *H05K 1/021* (2013.01); *H05K 1/115* (2013.01); *H05K 3/103* (2013.01);
(Continued)

(58) Field of Classification Search
CPC ................... H05K 1/021; H05K 1/115; H05K 2201/10106; H05K 2203/0117; H05K 1/0203; H05K 1/056
See application file for complete search history.

(56) References Cited

U.S. PATENT DOCUMENTS

| 2001/0036506 A1* | 11/2001 | Yamamoto | B32B 18/00 257/E23.009 |
| 2007/0164302 A1* | 7/2007 | Tanda | H10H 20/8506 362/267 |

(Continued)

FOREIGN PATENT DOCUMENTS

| JP | 2004-319644 A | 11/2004 |
| JP | 2005-085835 A | 3/2005 |

(Continued)

*Primary Examiner* — Sherman Ng
(74) *Attorney, Agent, or Firm* — Global IP Counselors, LLP

(57) ABSTRACT

A light-emitting module includes one or more light-emitting devices, and a wiring substrate. Each of the light-emitting devices includes light-emitting elements, and a package including a lower surface having a wiring region. The wiring substrate includes a metal portion, an electrode portion, and an insulating portion, and defines one or more first through holes. The mounting surface of the wiring substrate includes a first region where the metal portion defines an uppermost surface, a second region where the electrode portion defines an uppermost surface, and a third region where the insulating portion defines an uppermost surface. The first region and the second region are separated from each other by the third region. A boundary of each of the first through holes is defined in the first region. The wiring region of each of the light-emitting devices is bonded to the electrode portion of the wiring substrate.

13 Claims, 9 Drawing Sheets

(51) Int. Cl.
*H05K 1/18* (2006.01)
*H05K 3/10* (2006.01)

(52) U.S. Cl.
CPC .............. *H05K 2201/10106* (2013.01); *H05K 2203/0117* (2013.01)

(56) References Cited

U.S. PATENT DOCUMENTS

| | | | | |
|---|---|---|---|---|
| 2008/0233678 | A1* | 9/2008 | Takahashi | H01L 23/544 |
| | | | | 257/E21.499 |
| 2009/0001406 | A1* | 1/2009 | Okimura | H10H 20/8583 |
| | | | | 438/26 |
| 2009/0206718 | A1* | 8/2009 | Shimonishi | F21K 9/00 |
| | | | | 313/46 |
| 2011/0133236 | A1* | 6/2011 | Nozaki | H10H 20/8582 |
| | | | | 257/E33.072 |
| 2011/0272731 | A1* | 11/2011 | Suzuki | H10H 20/8581 |
| | | | | 257/E33.062 |
| 2012/0193671 | A1* | 8/2012 | Chien | H10H 20/8582 |
| | | | | 257/E33.059 |
| 2019/0103723 | A1* | 4/2019 | Miura | H01S 5/0225 |
| 2019/0364669 | A1* | 11/2019 | Matsuo | H05K 3/3431 |
| 2021/0184423 | A1* | 6/2021 | Kanazawa | H01S 5/02257 |
| 2022/0336717 | A1* | 10/2022 | Yuasa | H10H 20/821 |

FOREIGN PATENT DOCUMENTS

| | | |
|---|---|---|
| JP | 2008-091814 A | 4/2008 |
| JP | 2020-95939 A | 6/2020 |

\* cited by examiner

LIGHT-EMITTING MODULE, METHOD OF MANUFACTURING WIRING SUBSTRATE, AND METHOD OF MANUFACTURING LIGHT-EMITTING MODULE

CROSS-REFERENCE TO RELATED APPLICATIONS

This application claims priority to Japanese Patent Application No. 2022-147830, filed on Sep. 16, 2022, the disclosure of which is hereby incorporated herein by reference in its entirety.

BACKGROUND

The present invention relates to a light-emitting module, a method of manufacturing a wiring substrate, and a method of manufacturing a light-emitting module.

Japanese Patent Publication No. JP2020-95939A discloses a light-emitting module in which a light-emitting device is mounted on a mounting substrate with through holes formed therein. The mounting substrate is provided with a connection pattern for establishing electrical connection with the light-emitting device in order to supply electric power to the light-emitting device. It is also disclosed that the through holes formed in the mounting substrate can be used for screwing when the mounting substrate is fixed to another member.

SUMMARY

In consideration of fixing a wiring substrate to another member, the wiring substrate needs improvements in stability or safety thereof in the fixed state.

A light-emitting module disclosed in an embodiment includes one or more light-emitting devices, and a wiring substrate. Each of the one or more light-emitting devices includes a plurality of light-emitting elements, and a package including an upper surface provided with the plurality of light-emitting elements and a lower surface having a wiring region. The wiring substrate includes a metal portion, an electrode portion, and an insulating portion insulating the metal portion from the electrode portion, the wiring substrate defining one or more first through holes and including a mounting surface on which the one or more light-emitting devices are mounted. The mounting surface of the wiring substrate includes a first region where the metal portion defines an uppermost surface, a second region where the electrode portion defines an uppermost surface, and a third region where the insulating portion defines an uppermost surface. The first region and the second region are separated from each other by the third region on the mounting surface. A boundary of each of the one or more first through holes is defined in the first region on the mounting surface. The wiring region of each of the one or more light-emitting devices is bonded to the electrode portion of the wiring substrate.

A method of manufacturing a wiring substrate disclosed in an embodiment is a method of manufacturing the wiring substrate including a metal portion, an electrode portion, and an insulating portion. The method includes: preparing a metal member including a first portion having a first surface and a second portion having a second surface located at a lower position than the first surface, the metal member defining a through hole with a boundary of the through hole being defined by the first surface in a top view; providing a first insulating member and an electrode member over the second surface so that the metal member and the electrode member are separated from each other in the top view; and providing a second insulating member between the metal member and the electrode member.

A method of manufacturing a light-emitting module disclosed in an embodiment includes providing the wiring substrate manufactured by the method disclosed in the embodiment; preparing a light-emitting device including a plurality of light-emitting elements and a package including an upper surface provided with the plurality of light-emitting elements and a lower surface provided with a wiring region; and mounting the light-emitting device on the wiring substrate by bonding the wiring region of the package of the light-emitting device to the electrode portion of the wiring substrate.

According to certain embodiments, it is possible to improve the stability of fixation by screwing or the like.

DETAILED DESCRIPTION

Figure 1:
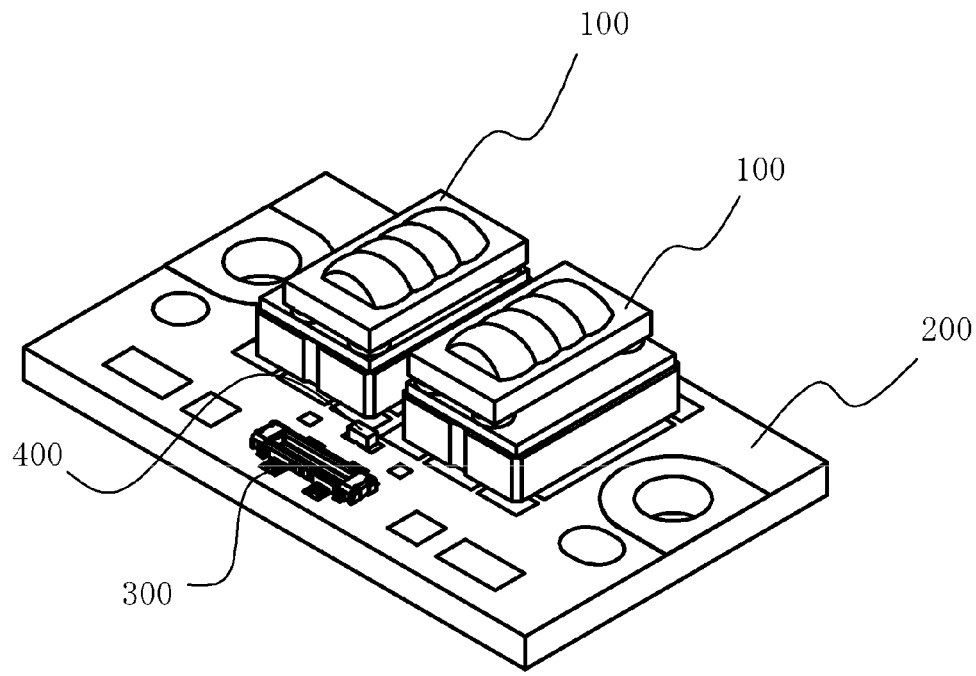
FIG. 1 is a perspective view of a light-emitting module according to an embodiment (in a state of not being fixed to a heat sink).

In this specification or the claims, polygons such as triangles and quadrangles, including shapes in which the corners of the polygon are rounded, beveled, chamfered, or coved, are referred to as polygons. A shape obtained by processing not only the corners (ends of sides) but also an intermediate portion of a side is similarly referred to as a polygon. That is, a shape that is partially processed while remaining a polygon shape as a base is included in the interpretation of "polygon" described in this specification and the claims.

The same applies not only to polygons but also to words representing specific shapes such as trapezoids, circles, protrusions, and recessions. The same applies when dealing with each side included in that shape. That is, even if processing is performed on a corner or an intermediate portion of a certain side, the interpretation of "side" includes the processed portion. When a "polygon" or "side" not partially processed is to be distinguished from a processed shape, "exact" will be added to the description as in, for example, "exact quadrangle".

Furthermore, in this specification or the claims, descriptions such as upper and lower, left and right, front and back, before and after, near and far, and the like are used merely to describe the relative relationship of positions, orientations, directions, and the like, and the expressions need not match an actual relationship at the time of use.

In the drawings, directions such as an X direction, a Y direction, and a Z direction may be indicated by using arrows. The directions of the arrows are consistent across multiple drawings of the same embodiment.

The term "member" or "portion" may be used to describe a component or the like in this specification. The term "member" refers to an object physically treated alone. The object physically treated alone can be an object treated as one part in a manufacturing step. On the other hand, the term "portion" refers to an object that need not be physically treated alone. For example, the term "portion" is used when part of one member is partially considered, a plurality of members are collectively considered as one object, or the like.

The distinction between "member" and "portion" described above does not indicate an intention to consciously limit the scope of rights in interpretation of the doctrine of equivalents. That is, even when there is a component described as "member" in the claims, this does not mean that the applicant recognizes that physically treating the component alone is essential in the application of the present invention.

In this specification and the claims, when there are a plurality of components and these components are to be indicated separately, the components may be distinguished by adding the terms "first" and "second" at the beginning of the names of the components. Objects to be distinguished may differ between this specification and the claims. Thus, even when a component in the claims is given the same term as that in this specification, the object indicated by that component is not the same across this specification and the claims in some cases.

For example, when there are components distinguished by being termed "first", "second", and "third" in this specification, and when components given the terms "first" and "third" in this specification are described in the claims, these components may be distinguished by being denoted as "first" and "second" in the claims for ease of understanding. In this case, the components denoted as "first" and "second" in the claims refer to the components termed "first" and "third" in this specification, respectively. This rule applies to not only components but also other objects in a reasonable and flexible manner.

Embodiments for implementing the present invention will be described below. Specific embodiments for implementing the present invention will be described below with reference to the drawings. Embodiments for implementing the present invention are not limited to the specific embodiments. That is, the illustrated embodiments are not an only form in which the present invention is realized. Sizes, positional relationships, and the like of members illustrated in each of the drawings may sometimes be exaggerated in order to facilitate understanding.

Embodiment

Figure 2:
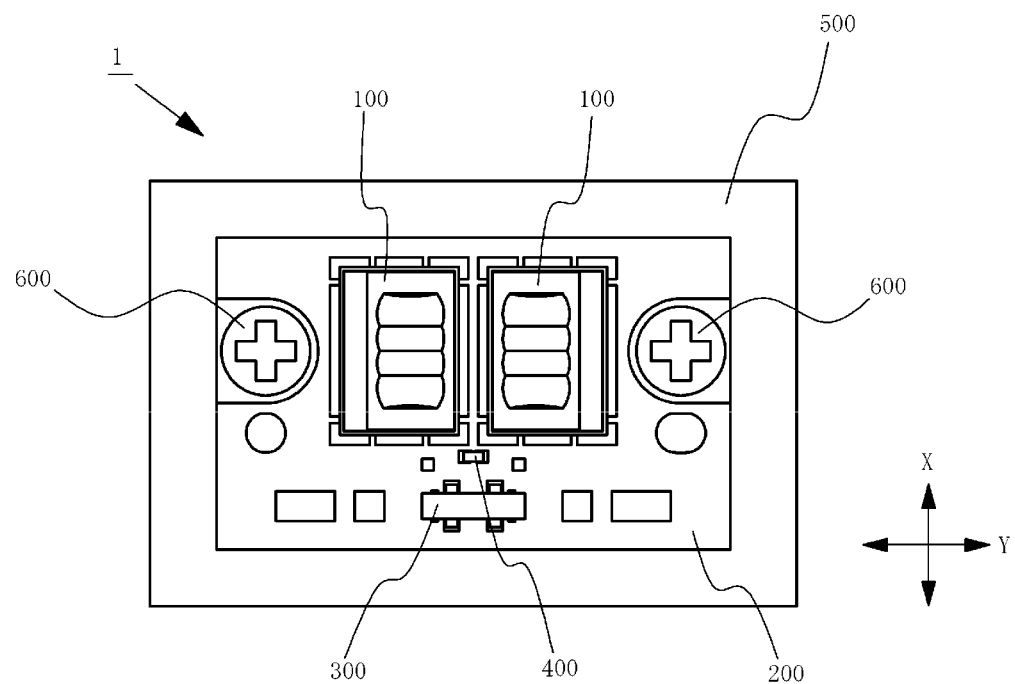
FIG. 2 is a top view of a light-emitting module according to the embodiment.
Figure 3:
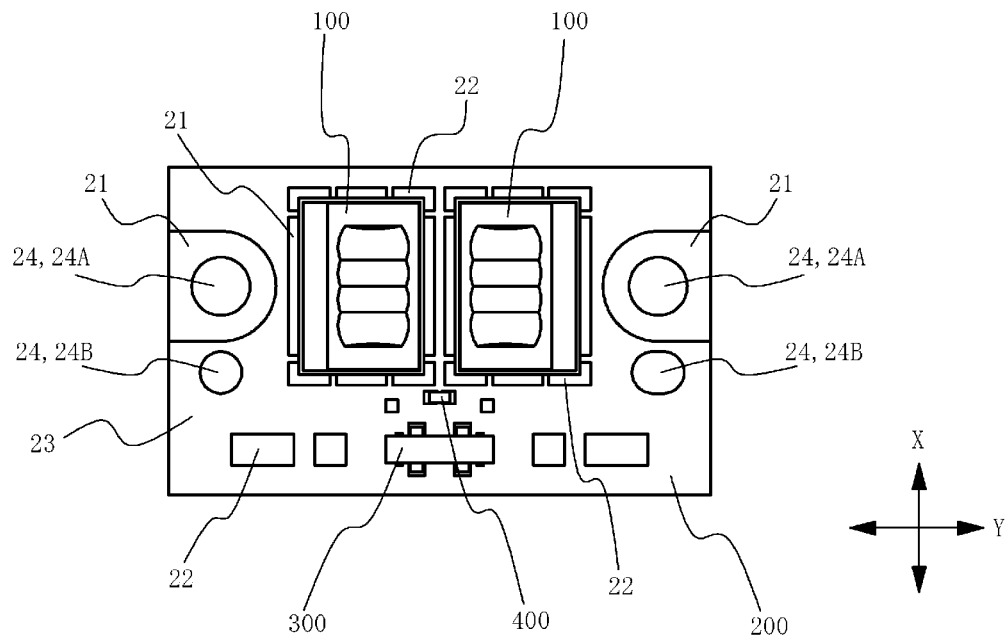
FIG. 3 is a top view of the light-emitting module in FIG. 1 (in a state of not being fixed to a heat sink).
Figure 4:
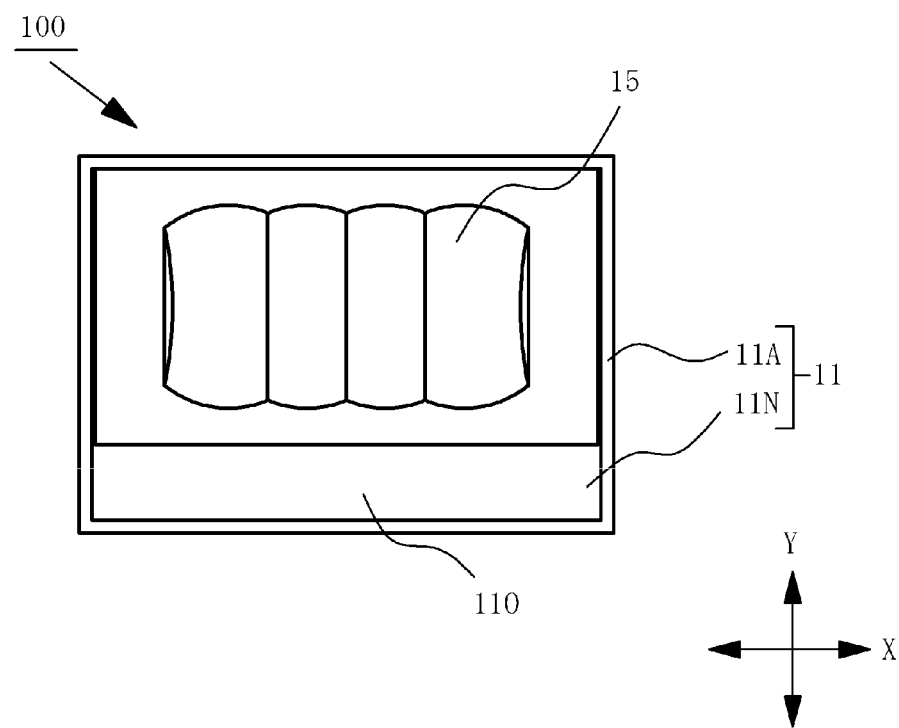
FIG. 4 is a top view of a light-emitting device according to the embodiment.
Figure 5:
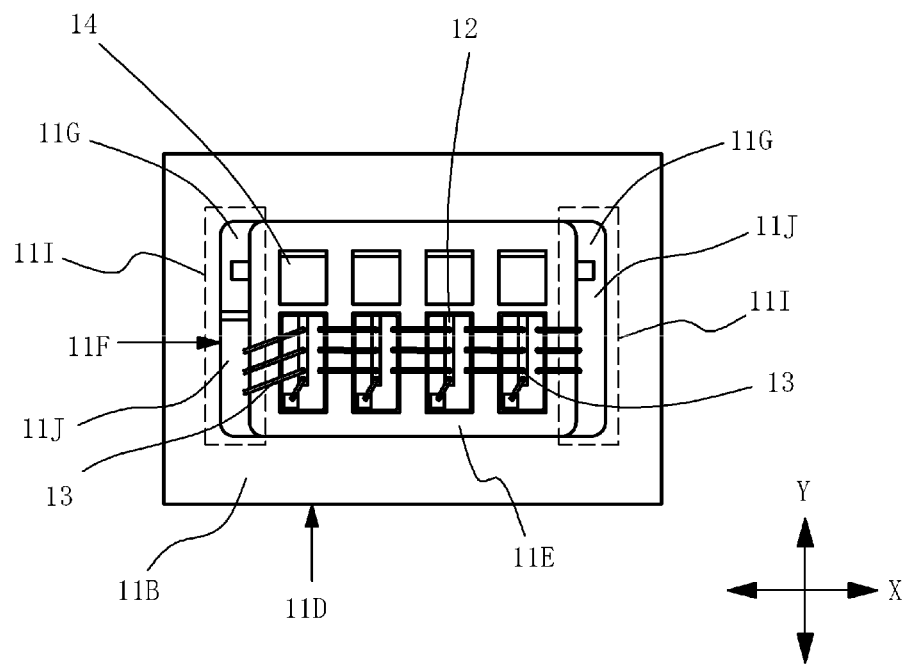
FIG. 5 is a top view for explaining an internal structure of a light-emitting device according to the embodiment.
Figure 6:
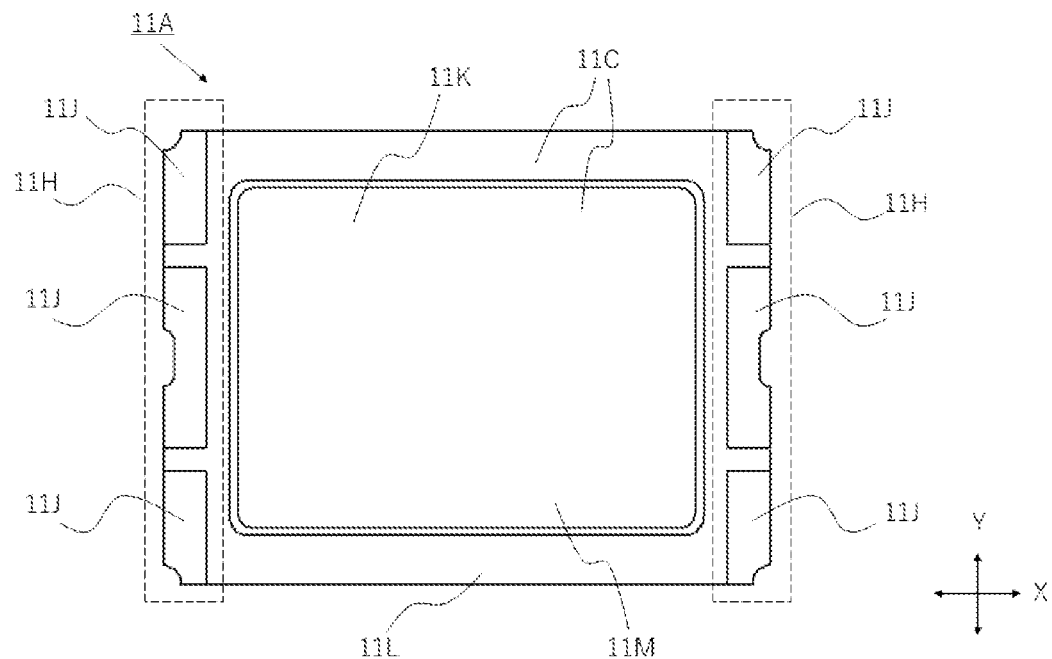
FIG. 6 is a bottom view of a light-emitting device according to the embodiment.
Figure 7A:
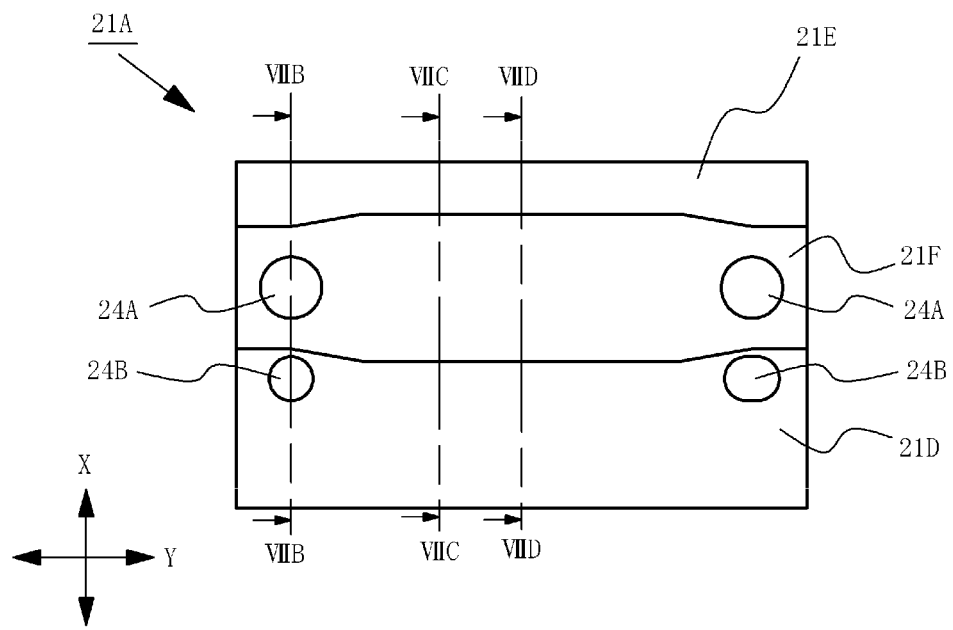
FIG. 7A is a top view for explaining one step in a manufacturing method of a wiring substrate according to the embodiment.
Figure 7B:
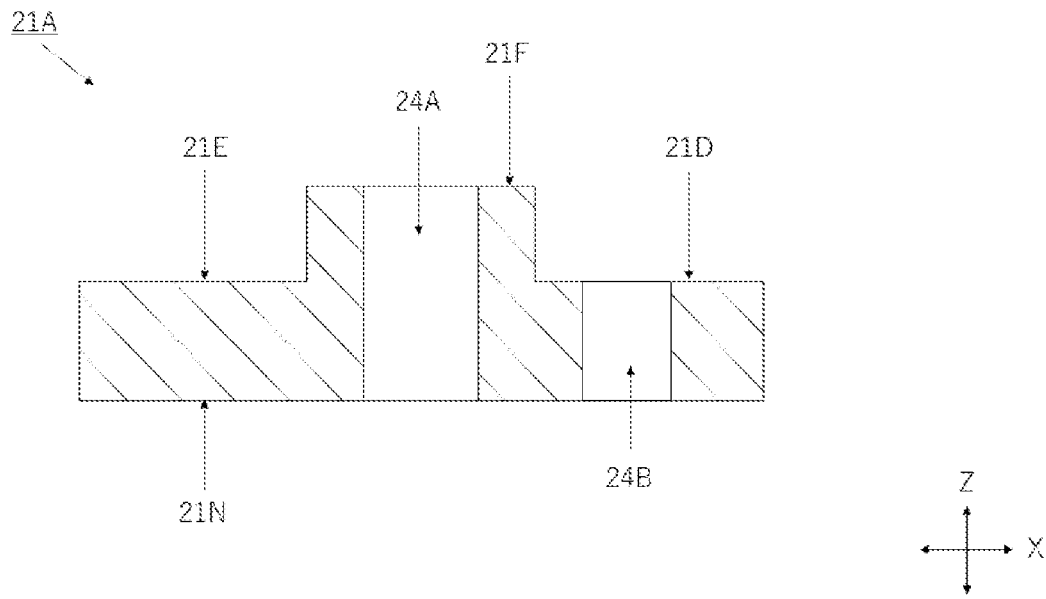
FIG. 7B is a cross-sectional view taken along a line VIIB-VIIB in FIG. 7A.
Figure 7C:
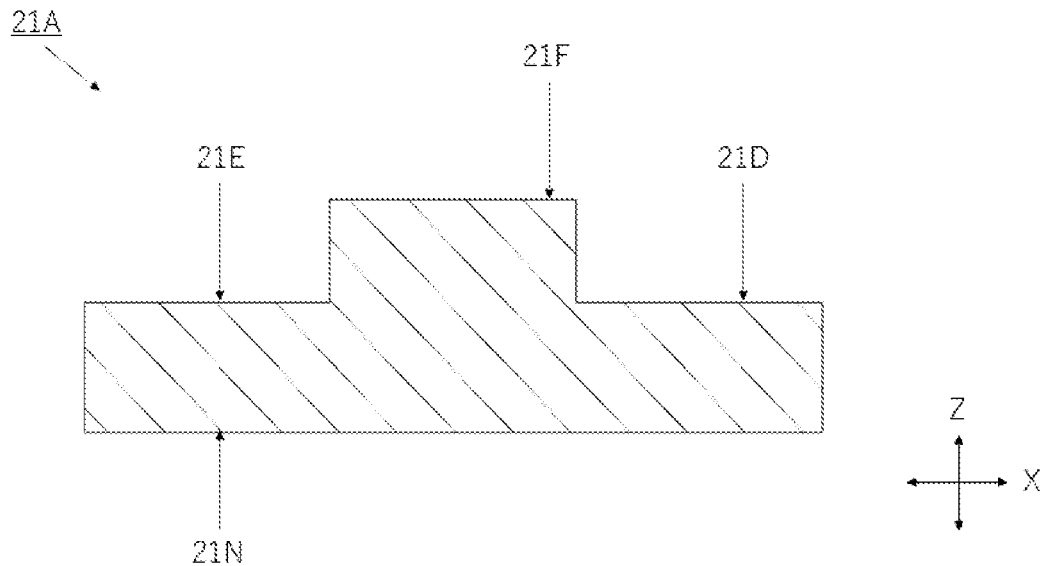
FIG. 7C is a cross-sectional view taken along a line VIIC-VIIC in FIG. 7A.
Figure 7D:
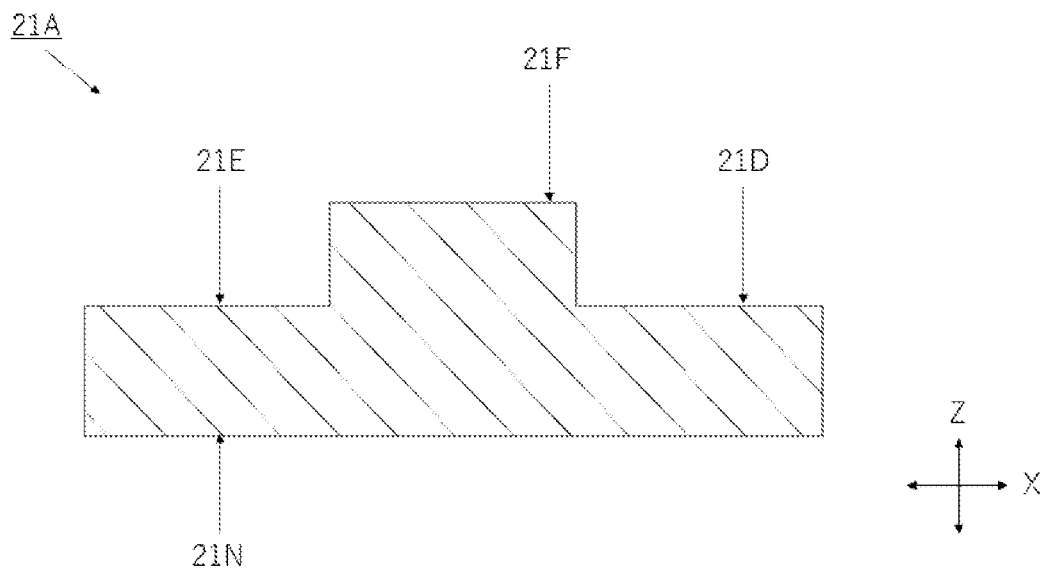
FIG. 7D is a cross-sectional view taken along a line VIID-VIID in FIG. 7A.
Figure 8A:
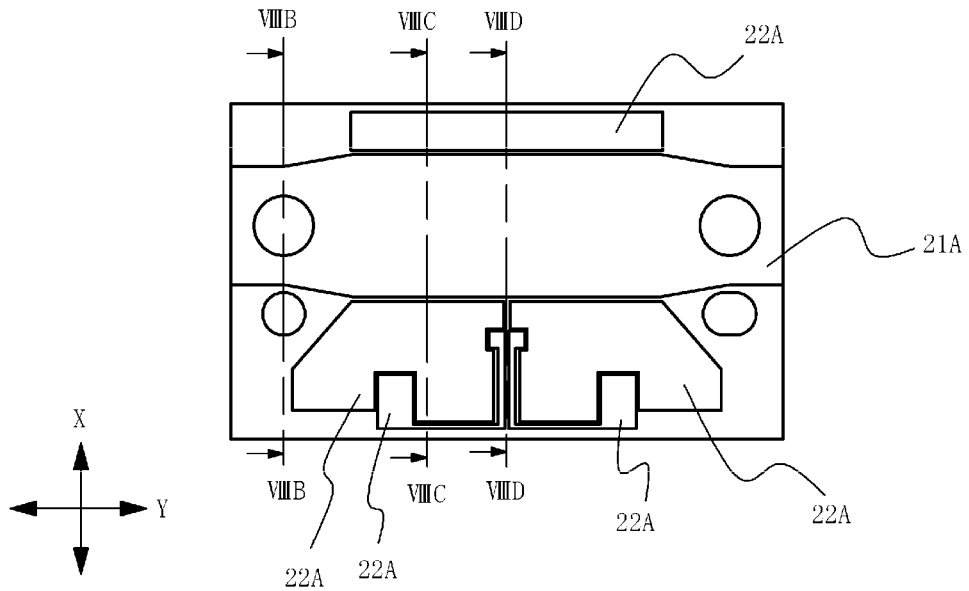
FIG. 8A is a top view for explaining another step in the manufacturing method of the wiring substrate according to the embodiment.
Figure 8B:
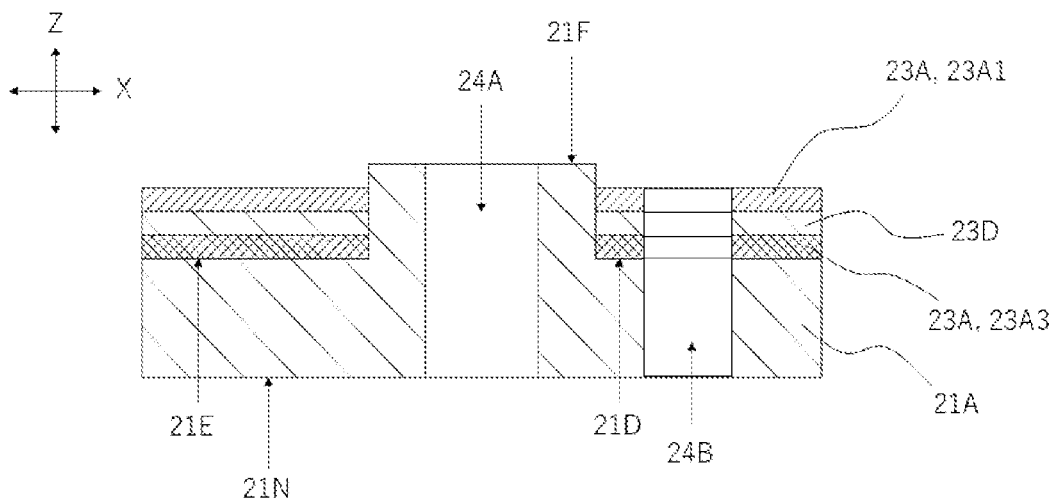
FIG. 8B is a cross-sectional view taken along a line in FIG. 8A.
Figure 8C:
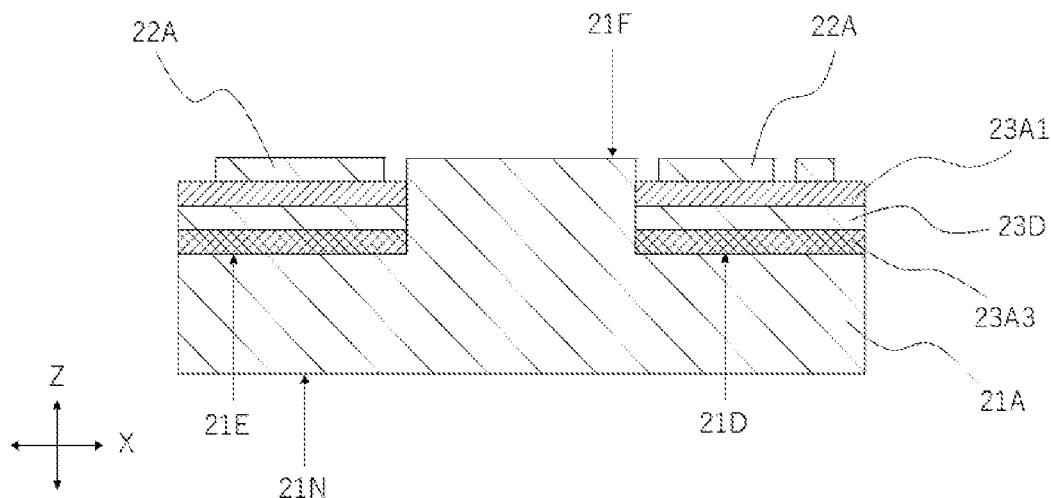
FIG. 8C is a cross-sectional view taken along a line VIIIC-VIIIC in FIG. 8A.
Figure 8D:
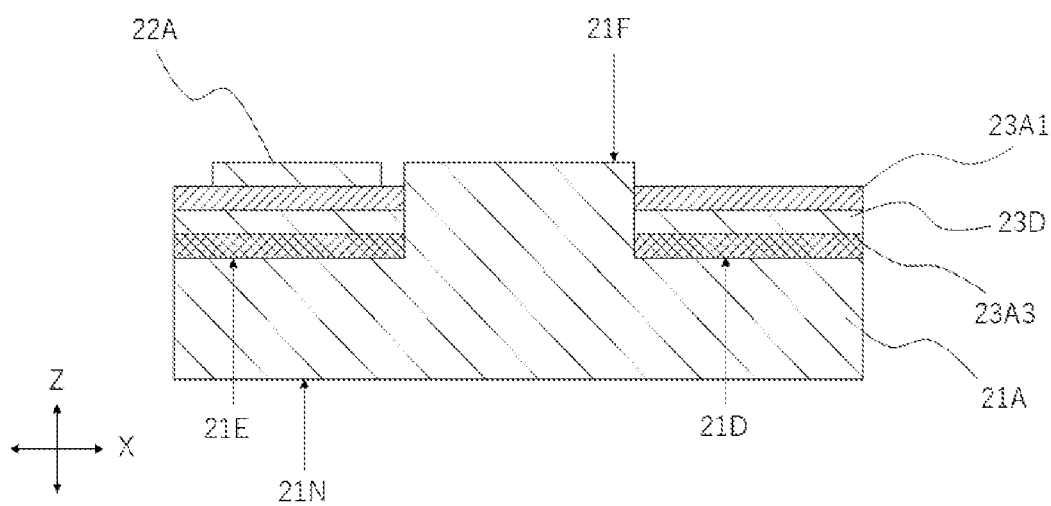
FIG. 8D is a cross-sectional view taken along a line VIIID-VIIID in FIG. 8A.
Figure 9A:
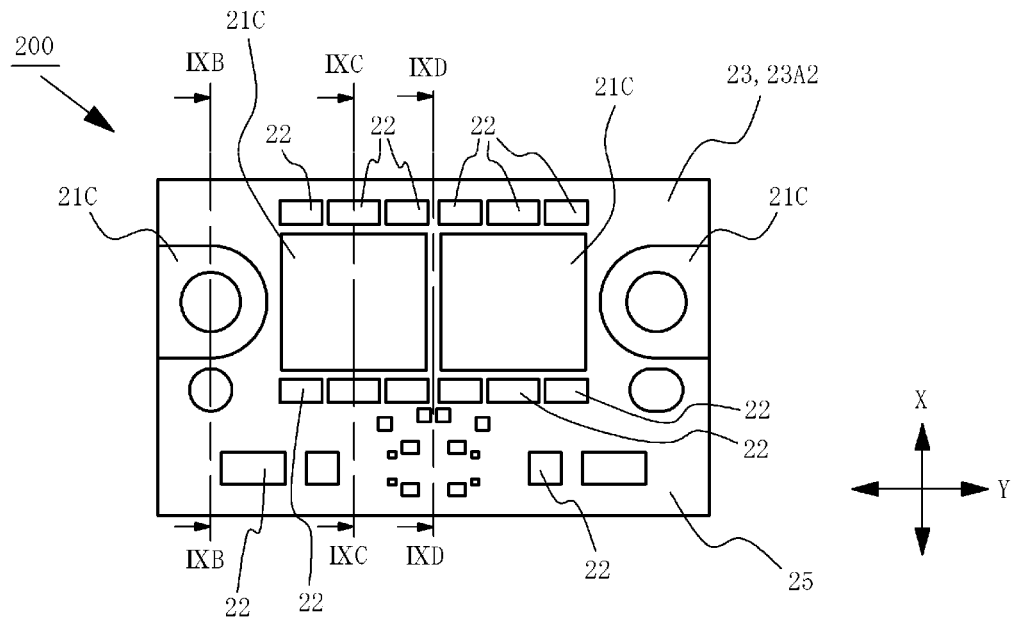
FIG. 9A is a top view for explaining another step in the manufacturing method of the wiring substrate according to the embodiment.
Figure 9B:
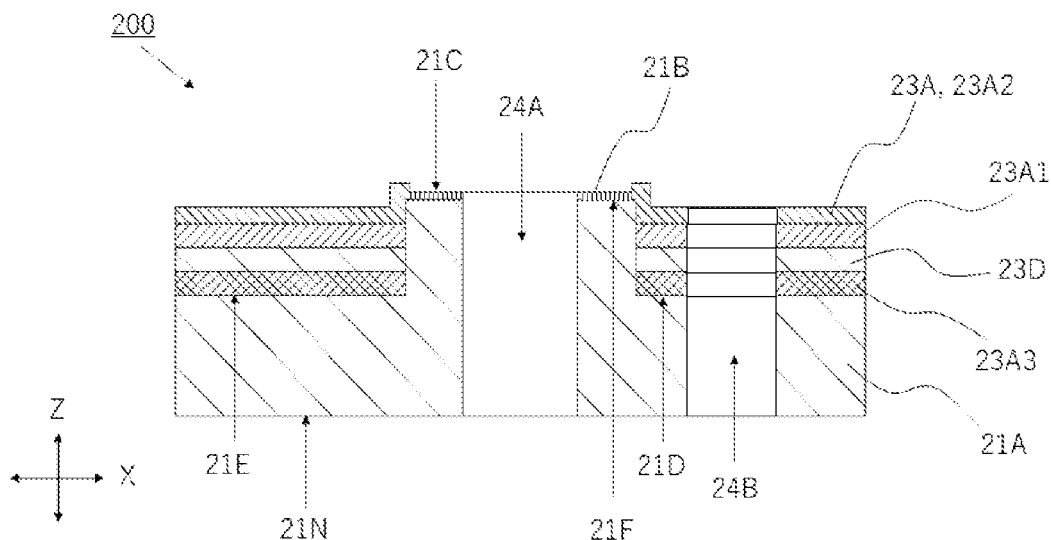
FIG. 9B is a cross-sectional view taken along a line IXB-IXB in FIG. 9A.
Figure 9C:
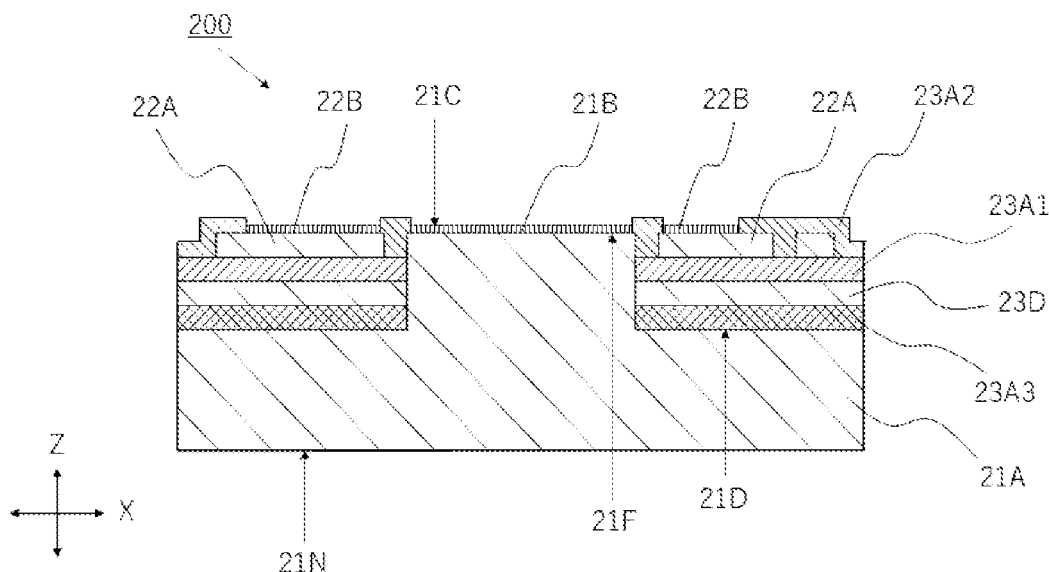
FIG. 9C is a cross-sectional view taken along a line IXC-IXC in FIG. 9A.
Figure 9D:
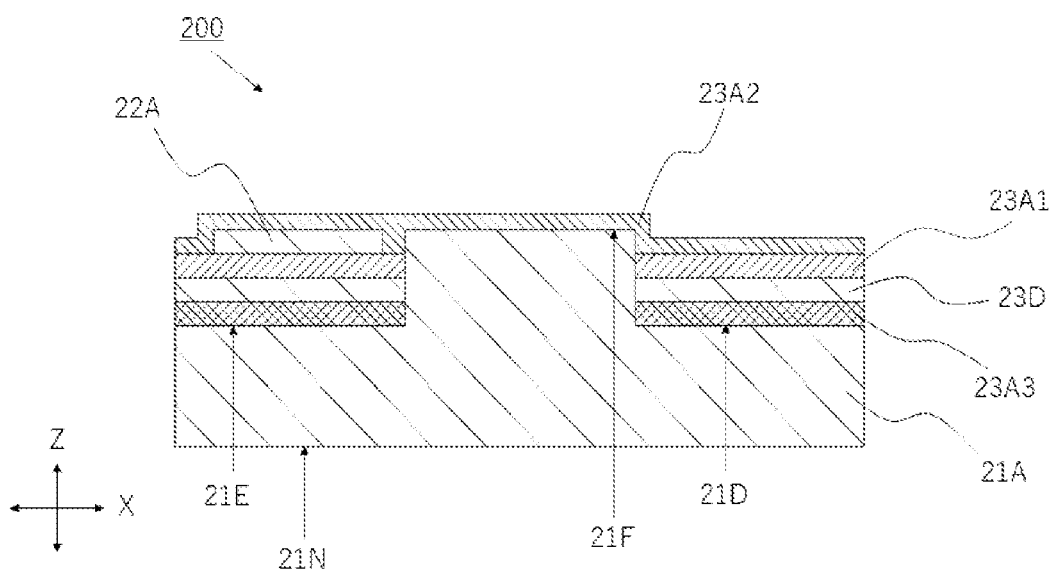
FIG. 9D is a cross-sectional view taken along a line IXD-IXD in FIG. 9A.

A light-emitting module 1 according to the embodiment will be described. FIGS. 1 to 9D are drawings for explaining an exemplary form of the light-emitting module 1. FIG. 1 is a perspective view of the light-emitting module 1 in a state of not being fixed to a heat sink 500. FIG. 2 is a top view of the light-emitting module 1 in a state of being fixed to the heat sink 500. FIG. 3 is a top view of the light-emitting module 1 in the same state as that in FIG. 1. FIG. 4 is a top view of a light-emitting device 100. FIG. 5 is a top view for explaining an internal structure of the light-emitting device 100. FIG. 6 is a bottom view of the light-emitting device 100. The drawings from FIGS. 7A to 9D are diagrams for explaining a method of manufacturing a wiring substrate 200. Note that FIG. 9A is also a top view of the wiring substrate 200.

The light-emitting module 1 includes a plurality of components. The plurality of components included in the light-emitting module 1 include one or more light-emitting devices 100, the wiring substrate 200, a connector 300, a thermistor 400, the heat sink 500, and a fixing member 600. The light-emitting module 1 may also include a component other than these components. For example, the light-emitting module 1 may include a light-emitting device different from the light-emitting devices 100. The light-emitting module 1 need not include some of the plurality of components described above.

First, each of the components will be described.

Light-Emitting Device 100

The light-emitting device 100 includes a plurality of components. The plurality of components included in the light-emitting device 100 include a package 11, one or more light-emitting elements 12, a plurality of wiring lines 13, one or more reflective members 14, and a lens member 15. The package 11 includes a base 11A and a lid member 11N. Note that the light-emitting device 100 may include a component other than the components described above. For example, the light-emitting device 100 may further include a light-emitting element in addition to the one or more light-emitting elements 12. The light-emitting device 100 need not include some of the plurality of components described above.

Package 11

The package 11 includes an upper surface 11E and a lower surface 11C. The package 11 includes an upper surface 11O and one or more outer lateral surfaces. In the following description, in order to distinguish the upper surface 11E from the upper surface 11O with ease, the upper surface 11E is referred to as a mounting surface 11E to be distinguished from other upper surfaces.

In a top view, an outer edge shape of the package 11 is rectangular. This rectangular shape may be a shape with long sides and short sides. In the illustrated package 11, the long side direction of the rectangle is the same direction as the X direction, and the short side direction thereof is the same direction as the Y direction. The outer edge shape of the package 11 in the top view need not be rectangular.

The package 11 includes a wiring region 11H. The wiring region 11H is provided on the lower surface 11C. One or more wiring patterns 11J are provided in the wiring region 11H. The package 11 includes a wiring region 11I. One or more wiring patterns 11J are provided in the wiring region 11I. The wiring pattern 11J provided in the wiring region 11H and the wiring pattern 11J provided in the wiring region 11I are electrically connected to each other. In the following description, the wiring region 11H is referred to as a first wiring region 11H, and the wiring region 11I is referred to as a second wiring region 11I to distinguish them from each other.

The package 11 includes a heat dissipation region 11K. The heat dissipation region 11K is provided on the lower surface 11C. The first wiring region 11H can be considered as two separate regions between which the heat dissipation region 11K is sandwiched. The one or more wiring patterns 11J are provided in each of these two regions. The heat dissipation region 11K is disposed at a position through which a virtual straight line passing through the above two regions passes.

The package 11 includes the base 11A and the lid member 11N. The lid member 11N is bonded to the base 11A. The base 11A includes the mounting surface 11E and the lower surface 11C of the package 11. The lid member 11N includes the upper surface 11O of the package 11. An outer lateral surface 11D of the base 11A is the outer lateral surface of the package 11. An outer lateral surface of the lid member 11N is the outer lateral surface of the package 11.

An internal space in which other components are disposed is formed in the package 11. The second wiring region 11I may be part of a region defining the internal space.

The base 11A includes an upper surface 11B, the lower surface 11C, the mounting surface 11E, and one or more outer lateral surfaces 11D. In a top view, an outer edge shape of the base 11A is rectangular. This rectangular shape may be a shape with long sides and short sides. In the illustrated base 11A, the long side direction of the rectangle is the same direction as the X direction, and the short side direction thereof is the same direction as the Y direction. The outer edge shape of the base 11A need not be rectangular in the top view.

A recessed shape is formed in the base 11A. The recessed shape recessed downward relative to the upper surface 11B is formed from the upper surface 11B. A recess is defined by the recessed shape of the base 11A. The recess is surrounded by the upper surface 11B in a top view.

An inner edge of the upper surface 11B defines an outer edge of the recess. That is, an inner edge shape of the upper surface 11B and an outer edge shape of the recess match each other. In the top view, the outer edge shape of the recess is rectangular. This rectangular shape may be a shape with long sides and short sides. In the illustrated base 11A, the long side direction of the rectangle is the same direction as the X direction, and the short side direction thereof is the same direction as the Y direction. The outer edge shape of the recess need not be rectangular.

The base 11A includes one or more inner lateral surfaces 11F. The mounting surface 11E is located below the upper surface 11B and above the lower surface 11C. The mounting surface 11E is a flat surface having a shape larger in width in the X direction than in the Y direction.

The one or more inner lateral surfaces 11F are located higher than the mounting surface 11E. The one or more inner lateral surfaces 11F meet the upper surface 11B. The mounting surface 11E and the one or more inner lateral surfaces 11F are included in the plurality of surfaces defining the recess of the base 11A. The one or more inner lateral surfaces 11F are provided perpendicular to the mounting surface 11E. The description of "perpendicular" here allows a difference within ±3 degrees. The inner lateral surface 11F need not be perpendicular to the mounting surface 11E.

The base 11A includes one or more step portions 11G. The step portion 11G includes an upper surface and an inner lateral surface that meets the upper surface and extends downward from the upper surface. The upper surface of the step portion 11G meets the inner lateral surface 11F. The inner lateral surface of the step portion 11G meets the mounting surface 11E.

The step portion 11G is formed along part of or the whole of the inner lateral surface 11F in a top view. The one or more step portions 11G are formed inside the upper surface 11B in the top view. The one or more step portions 11G are formed on the inner side of the one or more inner lateral surfaces 11F in the top view.

The base 11A may include a plurality of the step portions 11G. The plurality of step portions 11G are formed along the inner lateral surface 11F in a top view. The plurality of step portions 11G include the step portion 11G formed along the inner lateral surface 11F over the entire length of the inner lateral surface 11F in the top view.

The plurality of step portions 11G include, in the top view, the step portion 11G (hereinafter referred to as a first step portion) formed along a first inner lateral surface 11F, and the step portion 11G (hereinafter referred to as a second step portion) formed along a second inner lateral surface 11F. The first inner lateral surface 11F and the second inner lateral surface 11F are lateral surfaces facing each other and extending in the Y direction in the top view.

The second wiring region 11I is provided on the upper surface of the step portion 11G. The second wiring region 11I can be divided into a region provided for the first step portion 11G and a region provided for the second step portion 11G. The one or more wiring patterns 11J are provided in each of the divided regions. The wiring pattern 11J provided on the upper surface of the step portion 11G is electrically connected to the wiring pattern 11J provided on the lower surface 11C of the base 11A via a wiring line passing through the interior of the base 11A.

The base 11A may include a frame member 11L and a bottom member 11M. The frame member 11L includes the upper surface 11B of the base 11A, the one or more outer lateral surfaces 11D, the one or more inner lateral surfaces 11F, and the one or more step portions 11G. The bottom member 11M includes the mounting surface 11E.

The lower surface of the frame member 11L may constitute part of the region of the lower surface 11C of the base 11A, and the lower surface of the bottom member 11M may constitute the remaining region of the lower surface 11C of the base 11A. The first wiring region 11H is provided on the lower surface of the frame member 11L, and the heat dissipation region 11K is provided on the lower surface of the bottom member 11M. The entire lower surface of the bottom member 11M may serve as the heat dissipation region 11K.

The frame member 11L may be formed using a ceramic as the main material. The bottom member 11M may be formed using a metal or a composite containing a metal as the main material. Examples of the ceramic include aluminum nitride, silicon nitride, aluminum oxide, and silicon carbide. Examples of the metal include copper, aluminum, iron, copper-molybdenum, copper-tungsten, and the like. As the composite containing a metal, a copper-diamond composite material or the like can be used.

Here, the main material refers to a material that occupies the greatest proportion of a target formed product in terms of mass or volume. When a target formed product is formed of a single material, that material is the main material. In other words, when a certain material is the main material, the proportion of that material may be 100%.

The lid member 11N includes the upper surface 11O and a lower surface, and is formed in a rectangular parallelepiped flat plate shape. The shape thereof need not be the rectangular parallelepiped shape. The lower surface of the lid member 11N is bonded to the upper surface 11B of the base 11A, thereby forming the internal space of the package 11. The internal space may be a sealed space in a vacuum or airtight state.

The lid member 11N has light transmissivity to transmit light. Here, "having light transmissivity" means that the light transmittance is 80% or more. The light transmittance need not be equal to or more than 80% with respect to all wavelengths. The lid member 11N may partially include a non-light-transmissive region (a region with no light transmissivity).

The lid member 11N is formed using glass as the main material. The main material of the lid member 11N is a material having high light transmissivity. The lid member 11N is not limited to glass, and may be formed using sapphire as the main material, for example.

Light-Emitting Element 12

The light-emitting element 12 includes a light-emitting surface from which light is emitted. The light-emitting element 12 includes an upper surface, a lower surface, and a plurality of lateral surfaces. The lateral surface of the light-emitting element 12 serves as the light-emitting surface. The light-emitting element 12 includes one or more light-emitting surfaces.

The shape of the upper surface of the light-emitting element 12 is a rectangular shape having long sides and short sides. The shape of the upper surface of the light-emitting element 12 need not be a rectangle. A semiconductor laser element may be employed as the light-emitting element 12. The light-emitting element 12 is not limited to a semiconductor laser element, and a light-emitting diode or the like may be employed.

As the light-emitting element 12, for example, a light-emitting element that emits blue light, a light-emitting element that emits green light, or a light-emitting element that emits red light may be employed. A light-emitting element that emits light of another color may be employed as the light-emitting element 12.

Blue light refers to light having a light emission peak wavelength within a range from 420 nm to 494 nm. Green light refers to light having a light emission peak wavelength within a range from 495 nm to 570 nm. Red light refers to light having a light emission peak wavelength within a range from 605 nm to 750 nm.

Wiring Line 13

The wiring line 13 is formed of a conductor having a linear shape, both ends of which serve as bonding portions. In other words, the wiring line 13 includes the bonding portions to be bonded to other components, at both ends of the linear portion. The wiring line 13 is used for electrical connection between two components. For example, a metal wire may be used as the wiring line 13. Examples of the metal include gold, aluminum, silver, and copper.

Reflective Member 14

The reflective member 14 includes a lower surface, and a light reflective surface that reflects light. The light reflective surface is inclined relative to the lower surface. In other words, the light reflective surface is not perpendicular nor parallel in an arrangement relationship when viewed from the lower surface. A straight line connecting a lower end and an upper end of the light reflective surface is inclined relative to the lower surface of the reflective member 14. An angle of the light reflective surface with respect to the lower surface, or an angle of the straight line connecting the lower end and the upper end of the light reflective surface with respect to the lower surface is referred to as an inclination angle of the light reflective surface.

In the illustrated reflective member 14, the light reflective surface is a flat surface and forms an inclination angle of 45 degrees with respect to the lower surface of the reflective member 14. The light reflective surface is not limited to a flat surface, and may be, for example, a curved surface. The light reflective surface need not have an inclination angle of 45 degrees.

For the reflective member 14, glass, a metal, or the like may be used as the main material. As the main material, a heat-resistant material is preferable, and for example, glass such as quartz glass or borosilicate glass (BK7), or a metal such as aluminum can be employed. The reflective member 14 may also be formed using Si as the main material. When the main material is a reflective material, the light reflective surface can be formed of the main material. When the light reflective surface is formed of a material different from the main material, the light reflective surface can be formed using, for example, a metal such as Ag or Al, or a dielectric multilayer film of $Ta_2O_5/SiO_2$, $TiO_2/SiO_2$, $Nb_2O_5/SiO_2$, or the like.

In the light reflective surface, a reflectance to the peak wavelength of the light emitted to the light reflective surface is equal to or more than 90%. The reflectance may be equal to or more than 95%. The reflectance can be equal to or more than 99%. The light reflectance is equal to or less than 100%, or is less than 100%.

Lens Member 15

The lens member 15 includes an upper surface, a lower surface, and a lateral surface. The lens member 15 provides an optical effect, such as condensing, diffusing, or collimating, to incident light, and the light subjected to the optical effect is emitted from the lens member 15.

The lens member 15 includes one or more lens surfaces. The one or more lens surfaces are provided on the upper surface side of the lens member 15. The one or more lens surfaces may be provided on the lower surface side of the lens member 15. The lens member 15 includes the upper surface and the lower surface that are each a flat surface. The one or more lens surfaces meet the upper surface. The one or more lens surfaces are surrounded by the upper surface in the top view. In the top view, the lens member 15 has a rectangular outer shape. The lower surface of the lens member 15 is rectangular.

In the lens member 15, a portion that overlaps the one or more lens surfaces in the top view is a lens portion, and a portion that does not overlap them is a non-lens portion. In the lens member 15, a portion that overlaps the upper surface in the top view is included in the non-lens portion. When the lens portion is divided into two by a virtual flat surface including the upper surface, a distinction can be made between the lens surface side as a lens shape portion, and the lower surface side as a flat plate shape portion. The lower surface of the lens member 15 is formed of a lower surface of the lens portion and a lower surface of the non-lens portion.

In the lens member 15 including a plurality of the lens surfaces, the plurality of lens surfaces are continuously formed in one direction. That is, the plurality of lens surfaces are provided such that the lens surfaces are coupled to each other and are aligned in the same direction. The lens member 15 is formed such that the vertices of the respective lens surfaces are located on a single virtual straight line. This virtual straight line extends in the same direction as the X direction.

Here, in the top view, a direction in which the plurality of lens surfaces are aligned is referred to as a coupling direction. A length of the plurality of lens surfaces in the coupling direction is greater than a length in a direction perpendicular to the coupling direction in the top view. In the illustrated lens member 15, the coupling direction is the same direction as the X direction.

The lens member 15 has light transmissivity. In the lens member 15, both the lens portion and the non-lens portion have light transmissivity. The lens member 15 may be formed using glass such as BK7.

In the light-emitting device 100, the one or more light-emitting elements 12 are disposed on the mounting surface 11E of the package 11. The light-emitting element 12 may be disposed on the mounting surface 11E via a submount. The light-emitting device 100 includes a plurality of the light-emitting elements 12, and the plurality of light-emitting elements 12 may be disposed on the mounting surface 11E. The plurality of light-emitting elements 12 are disposed side by side on the mounting surface 11E. In the illustrated light-emitting device 100, the plurality of light-emitting elements 12 are disposed side by side in the X direction.

The light-emitting elements 12 emit light laterally from the light-emitting surface. Light is emitted from the light-emitting surface of each of the light-emitting elements 12 in the same direction. In this case, "the same direction" includes an angle difference of ±10 degrees. In the illustrated light-emitting device 100, each of the plurality of light-emitting elements 12 emits light in the Y direction from the light-emitting surface.

In the light-emitting device 100, the one or more light-emitting elements 12 are electrically connected to the package 11 with the plurality of wiring lines 13. Among the plurality of wiring lines 13, the wiring line 13 having one end of the bonding portion bonded to the package 11 is present. Among the plurality of wiring lines 13, the wiring line 13 having one end of the bonding portion bonded to the light-emitting element 12 is present.

The plurality of light-emitting elements 12 are electrically connected in series by the plurality of wiring lines 13. The one or more light-emitting elements 12 are electrically connected to the second wiring region 11I of the package 11. A current path connecting the one or more light-emitting elements 12 is formed between the second wiring region 11I provided for the first step portion 11G and the second wiring region 11I provided for the second step portion 11G.

The first wiring region 11H of the package 11 is divided into a region related to one electrode and a region related to the other electrode, for electrically connecting the one or more light-emitting elements 12. The first wiring region 11H related to the one electrode is referred to as a first wiring portion, and the first wiring region 11H related to the other electrode is referred to as a second wiring portion, for distinction. That is, the first wiring region 11H includes the first wiring portion and the second wiring portion.

The number of light-emitting elements 12 included in the light-emitting device 100 is in a range from two to seven. Alternatively, the number of light-emitting elements 12 included in the light-emitting device 100 is in a range from three to six. As the number of light-emitting elements 12 increases, the output of light emitted from one light-emitting device 100 increases. On the other hand, the number of light-emitting elements 12 also affects the size in the X direction of the wiring substrate 200, and when the number thereof is too large, there is a possibility that the warping of the wiring substrate 200 becomes a technical problem.

In the light-emitting device 100, the reflective member 14 that reflects light emitted from the light-emitting element 12 is disposed. The reflective member 14 is disposed on the mounting surface 11E. Light emitted from the one or more light-emitting elements 12 is reflected by the light reflective surfaces of the one or more reflective members 14. Light emitted from the plurality of light-emitting elements 12 may be reflected by one reflective member 14, or the light-emitting elements 12 and the reflective members 14 may be arranged corresponding to each other in a paired manner.

In the light-emitting device 100, the lens member 15 is disposed on the package 11. The lens member 15 is bonded to the package 11. One lens surface of the lens member 15 corresponds to light emitted from one light-emitting element 12.

Wiring Substrate 200

The wiring substrate 200 includes a metal portion 21, an electrode portion 22, and an insulating portion 23. The insulating portion 23 insulates the metal portion 21 and the electrode portion 22 from each other. The insulating portion 23 is provided to insulate electrical connection between the metal portion 21 and the electrode portion 22 in the wiring substrate 200. In a top view, the outer shape of the wiring substrate 200 is rectangular. The rectangular outer shape is a rectangular shape having long sides and short sides. In the illustrated wiring substrate 200, the long side direction is the same direction as the Y direction, and the short side direction is the same direction as the X direction.

The wiring substrate 200 includes a metal member 21A, an electrode member 22A, and an insulating member 23A. The wiring substrate 200 may include a plurality of the insulating members 23A. The metal member 21A is included in the metal portion 21, the electrode member 22A is included in the electrode portion 22, and one or more insulating members 23A are included in the insulating portion 23. The illustrated wiring substrate 200 includes the plurality of insulating members 23A including a first insulating member 23A1, a second insulating member 23A2, and a third insulating member 23A3.

The thickness of the wiring substrate 200 (width in the Z direction) is in a range from 0.5 mm to 3.0 mm. Preferably, the thickness of the wiring substrate 200 is in a range from 1.0 mm to 2.0 mm. When the thickness of the wiring substrate 200 is equal to or more than 1 mm, the strength can be improved. On the other hand, when the thickness is equal to or less than 2 mm, the wiring substrate 200 can be made thin.

For the metal member 21A, a metal material may be used as the main material. As the main material of the metal member 21A, for example, a simple substance of metal such as Cu, Ag, Al, Ni, Rh, Au, Ti, Pt, Pd, Mo, Cr, and W, or an alloy containing any of these metals may be used. The metal member 21A is preferably formed of a metal excellent in heat dissipation. The main material of the metal member 21A may be a material having the highest thermal conductivity among the main materials of the members constituting the wiring substrate 200. Cu is a preferable example of the main material of the metal member 21A. The metal member 21A may be formed containing 95 mass % or more of Cu.

For the electrode member 22A, a metal material may be used as the main material. As the main material of the electrode member 22A, for example, a simple substance of metal such as Cu, Ag, Al, Ni, Rh, Au, Ti, Pt, Pd, Mo, Cr, and W, or an alloy containing any of these metals may be used. Cu is a preferable example of the main material of the electrode member 22A. The electrode member 22A may be formed containing 95 mass % or more of Cu.

The insulating member 23A is formed of an insulating material. For example, polyimide may be used as the main material of the insulating member 23A. For the insulating member 23A, glass epoxy obtained by impregnating one or more glass cloths with a thermosetting insulating resin such as an epoxy resin and curing the thermosetting insulating resin, a liquid crystal polymer, or the like may be used as the main material, for example.

For example, film-like polyimide may be used for the first insulating member 23A1, a resist such as a solder resist may be used for the second insulating member 23A2, and a bonding sheet such as a heat-resistant resin sheet or a UV-curable sheet may be used for the third insulating member 23A3.

The wiring substrate 200 may further include a plating layer (metal layer). A plating layer may be provided in each of the plurality of regions of the wiring substrate 200. For example, the wiring substrate 200 includes a plating layer included in the metal portion 21 and a plating layer included in the electrode portion 22. In the following description, when these plating layers are distinguished from each other, the plating layer included in the metal portion 21 is referred to as a first plating layer 21B, and the plating layer included in the electrode portion 22 is referred to as a second plating layer 22B.

The wiring substrate 200 may further include a metal layer 23D. The metal layer 23D is included in the insulating portion 23. The metal layer 23D is provided between the first insulating member 23A1 and the third insulating member 23A3. The third insulating member 23A3, the metal layer 23D, and the first insulating member 23A1 are layered in that order to constitute a layered structure, thereby making it possible to form part of the insulating portion 23. Heat dissipation may be improved by providing the metal layer 23D.

For the plating layer, a metal material may be used as the main material. For example, Au, Ag, Cu, Pt, Ni, Pd, or an alloy containing one of these materials may be used as the main material of the plating layer. The metal layer 23D may be formed using the same material as that of the electrode member 22A.

The wiring substrate 200 includes a mounting surface 25. The wiring substrate 200 includes a lower surface 21N on the opposite side to the mounting surface 25. In the metal portion 21, the electrode portion 22, and the insulating portion 23, the mounting surface 25 includes a region where the metal portion 21 is the uppermost surface (hereinafter referred to as a first region), a region where the electrode portion 22 is the uppermost surface (hereinafter referred to as a second region), and a region where the insulating portion 23 is the uppermost surface (hereinafter referred to as a third region). On the mounting surface 25, the first region and the second region are separated from each other by the third region.

The metal portion 21 is exposed in the first region of the wiring substrate 200. The electrode portion 22 is exposed in the second region of the wiring substrate 200. The insulating portion 23 is exposed in the third region of the wiring substrate 200. The mounting surface 25 of the wiring substrate 200 may partially include a region in which none of the first region, the second region, and the third region are exposed. For example, a component other than the metal portion 21, the electrode portion 22, and the insulating portion 23 may be partially provided on the mounting surface 25.

One or more through holes 24 are provided in the wiring substrate 200. The wiring substrate 200 may be provided with a plurality of the through holes 24 including one or more first through holes 24A and one or more second through holes 24B. The illustrated wiring substrate 200 is provided with a plurality of the first through holes 24A. The illustrated wiring substrate 200 is provided with a plurality of the second through holes 24B.

In the wiring substrate 200, the one or more first through holes 24A are through holes used for fixing the wiring substrate 200 to another member (component). For example, a screw is fitted into the first through hole 24A to fix the wiring substrate 200 to another member.

In the wiring substrate 200, the one or more second through holes 24B are through holes used for positioning (determining positions) when fixing the wiring substrate 200 to another member. The first through hole 24A and the second through hole 24B are through holes used for mutually different purposes or applications. Note that the purposes or applications of the respective through holes need not be limited thereto.

Each first through hole 24A is formed surrounded by the first region in a top view. On the mounting surface 25, the boundary of each of the one or more first through holes 24A is defined by the metal portion 21. In a top view, the metal portion 21 surrounds the first through hole 24A. Since the first through hole 24A is defined by the metal on the mounting surface 25, for example, when screwing is performed, the wiring substrate can be pinched between the screw and another member in a state in which the screw is in contact with the metal, thereby making it possible to rigidly fix the wiring substrate.

In the first region of the mounting surface 25, a first partial region that defines the boundary of one first through hole 24A of two first through holes 24A and a second partial region that defines the boundary of the other first through hole 24A are spaced apart from each other.

Each second through hole 24B is formed surrounded by the third region in a top view. On the mounting surface 25, the boundary of each of the one or more second through holes 24B is defined by the insulating portion 23. In a top view, the insulating portion 23 surrounds the second through hole 24B. In the third region of the mounting surface 25, one continuous region defining the boundaries of two second through holes 24B is provided.

The first region of the mounting surface 25 is provided with one or more third partial regions which do not define the boundary of the first through hole 24A. Each third partial region is separated from the first partial region. Each third partial region is separated from the second partial region. In the wiring substrate 200, a plurality of the third partial regions may be arranged separate from each other. In a top view, the one or more first through holes 24A and the one or more third partial regions are provided at positions through which virtual straight lines parallel to the Y direction pass.

The metal portion 21 includes a first upper surface 21C and a second upper surface 21D at a position lower than that of the first upper surface 21C. The metal portion 21 includes a third upper surface 21E at a position lower than that of the first upper surface 21C. The metal portion 21 includes a lower surface. The lower surface of the metal portion 21 may be the lower surface 21N of the wiring substrate 200. The second upper surface 21D and the third upper surface 21E are both flat surfaces and are at the same height. The term "same height" used here allows a difference within 50 μm.

The first upper surface 21C is included in the first region of the wiring substrate 200. The first upper surface 21C is exposed on the mounting surface 25. The second upper surface 21D and the third upper surface 21E are not exposed on the mounting surface 25. For example, when the metal portion 21 includes the first plating layer 21B, the upper surface of the first plating layer 21B may be the first upper surface 21C. For example, when the metal portion 21 does not include a plating layer, the upper surface of the metal member 21A may be the first upper surface 21C.

The metal portion 21 may include a fourth upper surface that is located above the second upper surface 21D and the third upper surface 21E, is located at the same height as the first upper surface 21C or below the first upper surface 21C, and is not exposed on the mounting surface 25. The illustrated wiring substrate 200 includes the fourth upper surface (first surface 21F) located below the first upper surface 21C (see FIG. 9D).

In the metal portion 21, the first upper surface 21C is provided between the second upper surface 21D and the third upper surface 21E in a top view. The second upper surface 21D and the third upper surface 21E are separated from each other. In the top view, the second upper surface 21D and the third upper surface 21E are separated by the first upper surface 21C.

The metal member 21A includes the first surface 21F and a second surface at a position lower than the first surface 21F. The metal member 21A includes a third surface at a position lower than the first surface 21F. The metal member 21A includes a lower surface. The metal member 21A includes a protruding portion protruding from the second surface and the third surface. The protruding portion includes the first surface 21F.

The height of the protruding portion of the metal member 21A (the height from the second or third surface to the first surface 21F) is in a range from 30 μm to 300 μm. The height of the protruding portion is preferably in a range from 50 μm to 150 μm. When the height of the protruding portion is 50 μm or more, the thickness of the insulating portion 23 may be easily adjusted. On the other hand, when the height of the protruding portion is 150 μm or less, the wiring substrate 200 can be made thin.

In a top view (a plan view seen from a direction perpendicular to the first surface 21F), the outer shape of the metal member 21A is rectangular. The rectangular outer shape is a rectangular shape having long sides and short sides. In the illustrated metal member 21A, the long side direction is the same direction as the Y direction, and the short side direction is the same direction as the X direction.

The first surface 21F is provided between the second surface and the third surface in a top view. In the metal member 21A, the second surface and the third surface are separated from each other. In the top view, the second upper surface 21D and the third upper surface 21E are separated by the first surface 21F.

The maximum width of the second surface in a direction passing through the first surface 21F, the second surface, and the third surface in a top view (hereinafter referred to as a first direction) is greater than the maximum width of the third surface. In the illustrated wiring substrate 200, the first direction and the X direction are the same direction. For example, the maximum width of the second surface in the X direction is greater than the maximum width of the third surface.

The maximum width of the first surface 21F in the first direction is greater than the maximum width of the third surface. For example, the maximum width of the first surface 21F in the Y direction is greater than the maximum width of the third surface. The width of the first surface 21F in the first direction is not constant. The first surface 21F includes a wide portion where the width is relatively large and a narrow portion where the width is relatively small in the first direction in the first surface 21F. The first surface 21F is provided in such a manner that the wide portion is sandwiched between the two narrow portions in a top view. As described above, the size of the wiring substrate 200 may be reduced by appropriately adjusting the width instead of setting the width to be constant.

The outer shape of the wide portion of the first surface 21F is rectangular. The wide portion of the first surface 21F has a rectangular shape whose short side corresponds to the maximum width of the first surface 21F in the first direction. The narrow portion can also be defined as a region whose width in the first direction is less than the maximum width in the first surface 21F. The maximum width in the first direction of the wide portion may be in a range from 6.5 mm to 7.0 mm. The maximum width in the first direction of the wide portion may be greater than the maximum width in the first direction of the narrow portion by a length in a range from 0.8 mm to 1.5 mm.

The first surface 21F of the metal member 21A is located lower than the first upper surface 21C of the metal portion 21. Alternatively, the first surface 21F may be the first upper surface 21C of the metal portion 21. The second surface of the metal member 21A may be the second upper surface 21D of the metal portion 21. The third surface of the metal member 21A may be the third upper surface 21E of the metal portion 21. The lower surface of the metal member 21A may be the lower surface of the metal portion 21.

In the metal member 21A, from the upper surface across to the lower surface, a portion overlapping the first surface 21F in a top view is referred to as a first portion, a portion overlapping the second surface is referred to as a second portion, and a portion overlapping the third surface is referred to as a third portion. Accordingly, the first portion includes the first surface 21F, the second portion includes the second surface, and the third portion includes the third surface.

The one or more through holes 24 are provided in the metal portion 21. The metal portion 21 provided with the plurality of through holes 24 may be employed in the wiring substrate 200. The metal portion 21 may be provided with the plurality of through holes 24 including the first through holes 24A and the second through holes 24B. The metal portion 21 provided with the plurality of first through holes 24A may be employed in the wiring substrate 200. The metal portion 21 provided with the plurality of second through holes 24B may be employed in the wiring substrate 200.

In the first portion of the metal member 21A, the one or more through holes 24 are provided. The one or more first through holes 24A are provided in the first portion. The metal member 21A may be provided with the one or more through holes 24, the boundaries of which are defined by the first surface 21F in a top view. In the top view, at least one first through hole 24A is provided in each of the two narrow portions between which the wide portion is sandwiched. The first through hole 24A is not provided in the wide portion. The wide portion is not provided with any through hole including the through hole 24.

In the second portion of the metal member 21A, the one or more through holes 24 are provided. The one or more second through holes 24B may be provided in the second portion. The metal member 21A may be provided with the one or more second through holes 24B, the boundaries of which are defined by the second surface in the top view. In the third portion of the metal member 21A, no through hole 24 is provided. The third portion is not provided with any through hole including the through hole 24.

The insulating portion 23 is formed on the metal portion 21. The insulating portion 23 is formed on the second upper surface 21D and the third upper surface 21E of the metal portion 21. In the wiring substrate 200, the second upper surface 21D and the third upper surface 21E are not exposed in a top view. The entire surfaces of the second upper surface 21D and the third upper surface 21E are covered with the insulating portion 23.

The electrode portion 22 is provided on the second upper surface 21D of the metal portion 21. The electrode portion 22 is provided on the third upper surface 21E of the metal portion 21.

In this case, for distinction, portions of the electrode portion 22 and the insulating portion 23 provided over the second upper surface 21D of the metal portion 21 are respectively referred to as a first electrode portion 22 and a first insulating portion 23, and portions thereof provided over the third upper surface 21E of the metal portion 21 are respectively referred to as a second electrode portion 22 and a second insulating portion 23.

The first insulating portion 23 insulates the first electrode portion 22 and the metal portion 21 from each other. The second insulating portion 23 insulates the second electrode portion 22 and the metal portion 21 from each other. The first electrode portion 22 is provided over the second upper surface 21D with the first insulating portion 23 therebetween. The second electrode portion 22 is provided over the third upper surface 21E with the second insulating portion 23 therebetween.

On the mounting surface 25, the first region and a region formed by the first electrode portion 22 in the second region are separated from each other by the first insulating portion 23. On the mounting surface 25, the first region and a region formed by the second electrode portion 22 in the second region are separated from each other by the second insulating portion 23.

The insulating portion 23 may be formed on the fourth upper surface of the metal portion 21. On the mounting surface 25, the first partial region and the second partial region are separated from each other by the insulating portion 23. On the mounting surface 25, the first partial region and the third partial region are separated from each other by the insulating portion 23. On the mounting surface 25, the second partial region and the third partial region are separated from each other by the insulating portion 23.

The insulating member 23A is provided on the metal member 21A. The first insulating member 23A1 is provided over the second surface and the third surface of the metal member 21A. In a top view, the first insulating member 23A1 covers the second surface and the third surface of the metal member 21A.

The electrode member 22A is provided on the first insulating member 23A1. The electrode member 22A is not provided on the first surface 21F of the metal member 21A. The electrode portion 22 is not provided on the first surface 21F of the metal member 21A.

The electrode members 22A are provided in the plurality of regions separated from each other on the second surface. Accordingly, it can be said that the electrode members 22A are provided on the second surface. The electrode member 22A is provided in at least one region on the third surface. Therefore, it can be said that at least one electrode member 22A is provided on the third surface. In the illustrated wiring substrate, the electrode members 22A are provided in the four regions separated from each other on the second surface.

The second insulating member 23A2 is provided on the first insulating member 23A1. The second insulating member 23A2 may be provided on the electrode member 22A. The second insulating member 23A2 may be provided on the first surface 21F of the metal member 21A. The second insulating member 23A2 is provided over the second surface of the metal member 21A. The second insulating member 23A2 is provided over the third surface of the metal member 21A. The second insulating member 23A2 forms the third region on the mounting surface 25 of the wiring substrate 200.

The second insulating member 23A2 is partially provided on the first surface of the metal member 21A in a top view. The first partial region and the second partial region are formed by the second insulating member 23A2. The third partial region is formed by the second insulating member 23A2.

The second insulating member 23A2 is partially provided on the electrode member 22A in a top view. By the second insulating member 23A2, the electrode member 22A provided being connected in one region is further divided into a plurality of regions in a top view. In other words, although the electrode members 22A are provided in the plurality of regions separated from each other across the second insulating member 23A2 in the top view, the electrode members 22A provided in the plurality of regions are internally connected to each other.

The insulating portion 23 may further include the third insulating member 23A3. The third insulating member 23A3 is provided on the second surface and the third surface of the metal member 21A. The first insulating member 23A1 is provided over the third insulating member 23A3.

The insulating portion 23 may further include the metal layer 23D. The metal layer 23D is provided on the third insulating member 23A3. The first insulating member 23A1 is provided on the metal layer 23D.

In a top view, the first region is provided in a region overlapping the first portion and is not provided in a region overlapping the second portion. The first region is also not provided in a region overlapping the third portion in the top view. In the top view, the second region is provided in a region overlapping the second portion and is not provided in a region overlapping the first portion. The second region is also provided in a region overlapping the third portion in the top view. In the top view, the third region is provided in a region overlapping the first portion and is also provided in a region overlapping the second portion. The third region is also provided in a region overlapping the third portion in the top view.

Connector 300

The connector 300 has an insertion port into which a connector cable is inserted.

Thermistor 400

The thermistor may be used as an element for measuring temperatures.

Heat Sink 500

The heat sink 500 establishes a heat dissipation path for releasing heat generated in other components in order that the generated heat does not stay in those components. The heat sink 500 is made of a material having a relatively high thermal conductivity.

Fixing Member 600

The fixing member 600 is used when a certain component is fixed to another component. As the fixing member 600, for example, a screw may be employed.

Light-Emitting Module 1

The light-emitting module 1 will now be described.

In the light-emitting module 1, the one or more light-emitting devices 100 are disposed on the wiring substrate 200. The one or more light-emitting devices 100 are mounted on the mounting surface 25 of the wiring substrate 200. The first wiring regions 11H of the one or more light-emitting devices 100 are bonded to the electrode portions 22 of the wiring substrate 200. Each of the first wiring regions 11H is bonded to the electrode portion 22 via a conductive bonding material such as solder. The heat dissipation regions 11K of the one or more light-emitting devices 100 are bonded to the metal portion 21 of the wiring substrate 200.

Each light-emitting device 100 is bonded to the first electrode portion 22 and the second electrode portion 22 of the wiring substrate 200. Each light-emitting device 100 is bonded to the third partial region of the metal portion 21. One of the first wiring portion and the second wiring portion of the first wiring region 11H is bonded to the first electrode portion 22, and the other one thereof is bonded to the second electrode portion 22.

The light-emitting module 1 may include a plurality of the light-emitting devices 100 including a first light-emitting device 100 and a second light-emitting device 100. On the wiring substrate 200, the first light-emitting device 100 and the second light-emitting device 100 are electrically connected in series.

The one or more light-emitting elements 12 included in the first light-emitting device 100 are arranged in such a manner that the light-emitting surfaces face the second light-emitting device 100 side, and the one or more light-emitting elements 12 included in the second light-emitting device 100 are arranged in such a manner that the light-emitting surfaces face the first light-emitting device 100 side. The first light-emitting device 100 and the second light-emitting device 100 are arranged line-symmetrical to each other with respect to a median line between the first light-emitting device 100 and the second light-emitting device 100 in a top view. The second light-emitting device 100 is the light-emitting device 100, which is the same as the first light-emitting device 100.

Each of the first electrode portion 22 and the second electrode portion 22 includes a region to be bonded to the first light-emitting device 100 and a region to be bonded to the second light-emitting device 100. The former region is referred to as a first electrode region, while the latter region is referred to as a second electrode region.

The first electrode region is formed in one of the first electrode portions 22 respectively provided in two regions that are separated from each other in a top view and are not internally connected to each other, and the second electrode region is formed in the other one thereof. On the third surface, the first electrode region is formed in one of the second electrode portions 22 respectively provided in two regions that are separated from each other in the top view and are internally connected to each other, and the second electrode region is formed in the other one thereof. That is, in the wiring substrate 200 (when only the wiring substrate 200 is viewed), the first electrode region and the second electrode region of the first electrode portion 22 are not electrically connected to each other, while the first electrode region and the second electrode region of the second electrode portion 22 are electrically connected to each other.

The first electrode region of the first electrode portion 22 is bonded to the first wiring portion of the first light-emitting device 100. The second electrode region of the first electrode portion 22 is bonded to the second wiring portion of the second light-emitting device 100. The second electrode portion 22 is present midway in a current path from the first wiring portion of the first light-emitting device 100 to the second wiring portion of the second light-emitting device 100.

The first electrode region of the second electrode portion 22 is bonded to the second wiring portion of the first light-emitting device 100. The second electrode region of the second electrode portion 22 is bonded to the first wiring portion of the second light-emitting device 100. When only the wiring substrate 200 is viewed, the first electrode region and the second electrode region of the first electrode portion 22, which are not electrically connected to each other, are made to be electrically connected to each other by the first light-emitting device 100 and the second light-emitting device 100 being mounted on the wiring substrate 200.

By arranging the first light-emitting device 100 and the second light-emitting device 100 such that they are line-symmetrical to each other, the light-emitting module 1 with the first light-emitting device 100 and the second light-emitting device 100 being electrically connected in series may be achieved by using the light-emitting devices 100 having the same electrode arrangement of the light-emitting elements 12 as both the first light-emitting device 100 and the second light-emitting device 100.

In the light-emitting module 1, the connector 300 is disposed on the wiring substrate 200. The connector 300 is bonded to the first electrode portion 22 of the wiring substrate 200. The connector 300 is disposed on the second surface of the metal member 21A. The connector 300 is not disposed on the first surface 21F of the metal member 21A. The connector 300 is not disposed on the third surface of the metal member 21A.

The connector 300 is internally connected to the first electrode portion 22 bonded to the first light-emitting device 100, and is bonded to the first electrode portion 22 spaced apart from the first electrode region of the first electrode portion 22 in a top view. The connector 300 is internally connected to the first electrode portion 22 bonded to the second light-emitting device 100, and is bonded to the first electrode portion 22 spaced apart from the second electrode region of the first electrode portion 22 in the top view. By using the connector 300, power can be supplied to the one or more light-emitting devices 100 by using connector cables.

In the light-emitting module 1, the thermistor 400 is disposed on the wiring substrate 200. The thermistor 400 is bonded to the first electrode portion 22 of the wiring substrate 200. Thermistor 400 is disposed on the second surface of the metal member 21A. The thermistor 400 is not disposed on the first surface 21F of the metal member 21A. The thermistor 400 is not disposed on the third surface of the metal member 21A.

The thermistor 400 is bonded to the first electrode portion 22 which is not electrically connected to the first electrode portions 22 provided in the first and second electrode regions and is provided in another region.

In the light-emitting module 1, the wiring substrate 200 is disposed on the heat sink 500. The wiring substrate 200 is fixed to the heat sink 500, and heat generated from the light-emitting device 100 is transferred to the heat sink 500 via the metal portion 21.

The wiring substrate 200 is fixed to the heat sink 500 by the fixing member 600. The fixing member 600 is inserted into the one or more first through holes 24A of the wiring substrate 200. Taking screws as an example, the screws are fitted into the one or more first through holes 24A provided in the wiring substrate 200, and the wiring substrate 200 is pinched between the screws and the heat sink 500, whereby the wiring substrate 200 is fixed to the heat sink 500. At this time, since the screws come into contact with the metal portion 21 of the wiring substrate 200, it is possible to firmly screw the wiring substrate 200. This improves the stability of the mounting state (fixing state) of the light-emitting module 1. When conductive screws are used, even in a case in which the heat sink 500 has a potential when the light-emitting module 1 is driven, the metal portion 21 of the wiring substrate 200 and the heat sink 500 have the same potential, thereby making it possible to suppress the occurrence of electromigration in the electrode portion 22.

Method of Manufacturing Wiring Substrate 200

The above-described wiring substrate 200 may be manufactured by a manufacturing method including, for example, a step of preparing the metal member 21A (hereinafter referred to as step 1), a step of providing the first insulating member 23A1 and the electrode member 22A (hereinafter referred to as step 2), and a step of providing the second insulating member 23A2 (hereinafter referred to as step 3).

In step 1, the metal member 21A is prepared. The metal member 21A may be manufactured by, for example, forming a metal plate by pressing, and forming the through holes 24 by drilling (see FIGS. 7A to 7C).

In step 2, the first insulating member 23A1 and the electrode member 22A are provided on the upper surface of the metal member 21A. In this step, the first insulating member 23A1 and the electrode member 22A are provided over the second surface of the metal member 21A. Further, in this step, the first insulating member 23A1 and the electrode member 22A are provided over the third surface of the metal member 21A. In this step, the first insulating member 23A1 and the electrode member 22A are not provided on the first surface 21F of the metal member 21A. (See FIG. 8A to FIG. 8C)

The electrode member 22A is located on the first insulating member 23A1. The first insulating member 23A1 and the electrode member 22A can be provided over the metal member 21A in a state where the electrode member 22A is provided on the first insulating member 23A1. Alternatively, after the first insulating member 23A1 is provided over the metal member 21A, the electrode member 22A may be provided on the first insulating member 23A1.

When the wiring substrate 200 includes the third insulating member 23A3, the first insulating member 23A1 is provided over the metal member 21A in a state in which the first insulating member 23A1 is provided over the third insulating member 23A3. Alternatively, after the third insulating member 23A3 is provided on the metal member 21A, the first insulating member 23A1 may be provided over the third insulating member 23A3.

When the wiring substrate 200 includes the metal layer 23D, the first insulating member 23A1 is provided over the metal member 21A in a state in which the metal layer 23D is provided between the first insulating member 23A1 and the third insulating member 23A3. Alternatively, after the third insulating member 23A3 is provided on the metal member 21A, the metal layer 23D may be provided on the third insulating member 23A3, and then the first insulating member 23A1 may be provided on the metal layer 23D.

In a top view, the first insulating member 23A1 covers the second surface and the third surface of the metal member 21A. The electrode members 22A are provided in the plurality of regions separated from each other over the second surface of the metal member 21A. The electrode member 22A is provided in at least one region over the second surface of the metal member 21A. The electrode member 22A is electrically insulated from the metal member 21A via the first insulating member 23A1.

In step 3, the second insulating member 23A2 is provided between the metal member 21A and the electrode member 22A separated from each other. The second insulating member 23A2 is provided over the first surface and the second surface of the metal member 21A. Further, the second insulating member 23A2 is provided over the third surface of the metal member 21A.

The wiring substrate 200 may be manufactured by the manufacturing method further including a step of providing the plating layer 22B (hereinafter referred to as step 4). In step 4, the plating layer 22B is formed in a region where the metal member 21A and the electrode member 22A are provided in a top view.

Manufacturing Method of Light-Emitting Module 1

The above-described light-emitting module 1 may be manufactured by a manufacturing method including, for example, a step of preparing the wiring substrate 200 (hereinafter referred to as step 5), a step of preparing the light-emitting device 100 (hereinafter referred to as step 6), a step of mounting the light-emitting device 100 on the wiring substrate 200 (hereinafter referred to as step 7), and a step of fixing the wiring substrate 200 to the heat sink (hereinafter referred to as step 8).

In step 5, the above-mentioned wiring substrate 200 or the wiring substrate 200 manufactured by the above-described manufacturing method is prepared. That is, the wiring substrate 200 prepared in this step is not limited to the wiring substrate 200 manufactured by the above-described manufacturing method, and may be the wiring substrate 200 manufactured by another manufacturing method.

In step 6, the above-mentioned light-emitting device 100 is prepared. The one or more light-emitting devices 100 are prepared in this step. In this step, the plurality of light-emitting devices 100 including the first light-emitting device 100 and the second light-emitting device 100 are prepared.

In step 7, the light-emitting device 100 is mounted on the wiring substrate 200. In this step, the wiring region of the light-emitting device 100 is bonded to the electrode portion 22 (or the electrode member 22A) of the wiring substrate 200. In this step, the heat dissipation region of the light-emitting device 100 is bonded to the metal portion 21 (or the metal member 21A) of the wiring substrate 200.

In this step, the first wiring portion of the first light-emitting device 100 is bonded to the first electrode portion 22, and the second wiring portion of the first light-emitting device 100 is bonded to the second electrode portion 22. The first wiring portion of the second light-emitting device 100 is bonded to the second electrode portion 22, and the second wiring portion of the second light-emitting device 100 is bonded to the first electrode portion 22.

Before or after step 7, there may be a step of mounting the connector 300 on the wiring substrate 200. Before or after step 7, there may be a step of mounting the thermistor 400 on the wiring substrate 200.

In step 8, the wiring substrate 200 is fixed to the heat sink 500. In this step, the wiring substrate 200 is fixed to the heat sink 500 by using the fixing member 600. The fixing member 600 is inserted into the first through hole 24A of the wiring substrate 200 to fix the wiring substrate 200 to the heat sink 500.

Although each of the embodiments according to the present disclosure has been described above, the light-emitting device according to the present disclosure is not strictly limited to the light-emitting device in each of the embodiments. In other words, the aspects to the present disclosure can be achieved without being limited to the external shape or structure of the light-emitting device disclosed by each of the embodiments. The aspects of the present disclosure can be applied without requiring all the components being sufficiently provided. For example, in a case in which some of the components of the light-emitting device disclosed by the embodiments are not stated in the claims, the degree of freedom in design by those skilled in the art such as substitutions, omissions, shape modifications, and material changes for those components is allowed, and then the invention stated in the claims being applied to those components is specified.

Throughout the contents described in this specification, the following aspects of technical matters are disclosed.

Aspect 1

A light-emitting module including: one or more light-emitting devices each including a plurality of light-emitting elements and a package including an upper surface provided with the plurality of light-emitting elements and a lower surface provided with a wiring region; and a wiring substrate including a metal portion, an electrode portion, and an insulating portion insulating the metal portion from the electrode portion, the wiring substrate being provided with one or more first through holes and including a mounting surface on which the one or more light-emitting devices are mounted, wherein the mounting surface includes a first region where the metal portion among the metal portion, the electrode portion, and the insulating portion serves as an uppermost surface, a second region where the electrode portion serves as an uppermost surface, and a third region where the insulating portion serves as an uppermost surface, the first region and the second region are separated from each other by the third region of the insulating portion on the mounting surface, a boundary of each of the one or more first through holes is defined by the metal portion on the mounting surface, and the wiring region of each of the one or more light-emitting devices is bonded to the electrode portion of the wiring substrate.

Aspect 2

The light-emitting module according to Aspect 1, wherein the one or more first through holes are through holes used for fixing the wiring substrate to another member.

Aspect 3

The light-emitting module according to Aspect 1 or 2, wherein the wiring substrate is further provided with one or more second through holes used for determining a position when fixing the wiring substrate to another member, and a boundary of the one or more second through holes is defined by the insulating portion on the mounting surface.

Aspect 4

The light-emitting module according to any one of Aspects 1 to 3, wherein the metal portion includes a first upper surface constituting the first region, and a second upper surface and a third upper surface each located at a position lower than the first upper surface, the electrode portion includes a first electrode portion provided over the second upper surface and a second electrode portion provided over the third upper surface, the insulating portion includes a first insulating portion provided over the second upper surface and insulating the first electrode portion and the metal portion from each other, and a second insulating portion provided over the third upper surface and insulating the second electrode portion and the metal portion from each other, and the wiring region included in each of the one or more light-emitting devices includes a first wiring portion related to one electrode and a second wiring portion related to the other electrode.

Aspect 5

The light-emitting module according to Aspect 4, wherein the one or more light-emitting devices include a first light-emitting device and a second light-emitting device, the first light-emitting device and the second light-emitting device are electrically connected in series, each of the first electrode portion and the second electrode portion includes a first electrode region bonded to the first light-emitting device and a second electrode region bonded to the second light-emitting device, the first electrode region of the first electrode portion is bonded to the first wiring portion of the first light-emitting device, the second electrode region of the first electrode portion is bonded to the second wiring portion of the second light-emitting device, and the second electrode portion is present midway in a current path from the first wiring portion of the first light-emitting device to the second wiring portion of the second light-emitting device.

Aspect 6

The light-emitting module according to Aspect 5, wherein the first electrode region of the second electrode portion is bonded to the second wiring portion of the first light-emitting device, the second electrode region of the second electrode portion is bonded to the first wiring portion of the second light-emitting device, in the wiring substrate, the first electrode region and the second electrode region of the first electrode portion are not electrically connected to each other, and the first electrode region and the second electrode region of the second electrode portion are electrically connected to each other, and the first electrode region and the second electrode region of the first electrode portion are electrically connected by the first light-emitting device and the second light-emitting device being mounted on the wiring substrate.

Aspect 7

The light-emitting module according to any one of Aspects 4 to 6, wherein the insulating portion includes a first insulating member provided on the second upper surface and the third upper surface of the metal portion, and a second insulating member provided over the first insulating member and forming the third region.

Aspect 8

The light-emitting module according to any one of Aspects 4 to 7, wherein in the metal portion, the first upper surface is provided between the second upper surface and the third upper surface in a top view, and the second upper surface and the third upper surface are separated from each other.

Aspect 9

The light-emitting module according to any one of Aspects 1 to 8, further including a heat dissipation region on a lower surface of the package, wherein the heat dissipation region is bonded to the metal portion of the wiring substrate in the one or more light-emitting devices.

Aspect 10

The light-emitting module according to any one of Aspects 1 to 9, further including: a heat sink on which the wiring substrate is disposed; and one or more fixing members that are respectively inserted into the one or more first through holes to fix the wiring substrate to the heat sink.

Aspect 11

A method of manufacturing a wiring substrate including a metal portion, an electrode portion, and an insulating portion, the method including: preparing a metal member including a first portion including a first surface and a second portion including a second surface located at a lower position than the first surface, and provided with a through hole whose boundary is defined by the first surface in a top view; providing a first insulating member and an electrode member over the second surface; and providing a second insulating member between the metal member and the electrode member separated from each other.

Aspect 12

The method of manufacturing the wiring substrate, according to Aspect 11, wherein the preparing a metal member includes preparing the metal member further including a third portion including a third surface located at a lower position than the first surface, the providing a first insulating member and an electrode member includes providing the first insulating member and the electrode member over the second surface and over the third surface, and the first surface is provided between the second surface and the third surface in the top view.

Aspect 13

A method of manufacturing a light-emitting module, the method including: preparing the wiring substrate according to any one of Aspects 1 to 10, or the wiring substrate manufactured by the method of manufacturing the wiring substrate, according to Aspect 11 or 12; preparing a light-emitting device including a plurality of light-emitting elements and a package including an upper surface provided with the plurality of light-emitting elements and a lower surface provided with a wiring region; and mounting the light-emitting device on the wiring substrate by bonding the wiring region to the electrode portion of the wiring substrate.

Aspect 14

The method of manufacturing the light-emitting module, according to Aspect 13, wherein the preparing the wiring substrate includes preparing the wiring substrate according to Aspect 12, and the mounting the light-emitting device on the wiring substrate includes bonding the heat dissipation region to the metal portion and bonding the wiring region to the electrode portion provided over the second surface and to the electrode portion provided over the third surface.

The light-emitting device according to each of the embodiments may be used for a projector, a head-mounted display, lighting, an in-vehicle headlight, a display, and the like.

What is claimed is:

1. A light-emitting module comprising:
   one or more light-emitting devices each including
      a plurality of light-emitting elements, and
      a package including an upper surface provided with the plurality of light-emitting elements and a lower surface having a wiring region; and
   a wiring substrate including a metal portion, an electrode portion, and an insulating portion insulating the metal portion from the electrode portion, the wiring substrate defining one or more first through holes and including a mounting surface on which the one or more light-emitting devices are mounted, wherein
   the mounting surface of the wiring substrate includes a first region where the metal portion defines an uppermost surface, a second region where the electrode portion defines an uppermost surface, and a third region where the insulating portion defines an uppermost surface,
   the first region and the second region are separated from each other by the third region on the mounting surface,
   a boundary of each of the one or more first through holes is defined in the first region on the mounting surface,
   the wiring region of each of the one or more light-emitting devices is bonded to the electrode portion of the wiring substrate, and
   each of the one or more first through holes is configured to receive a fixing member to fix the wiring substrate to an additional member.

2. The light-emitting module according to claim 1, wherein
   the wiring substrate further defines one or more second through holes used for positioning the wiring substrate with respect to the additional member when fixing the wiring substrate to the additional member, and
   a boundary of the one or more second through holes is defined in the third region on the mounting surface.

3. The light-emitting module according to claim 1, wherein
   the metal portion of the wiring substrate includes a first upper surface constituting the first region, and a second upper surface and a third upper surface each located at a position lower than the first upper surface,
   the electrode portion of the wiring substrate includes a first electrode portion arranged over the second upper surface of the metal portion and a second electrode portion arranged over the third upper surface of the metal portion,
   the insulating portion of the wiring substrate includes a first insulating portion arranged over the second upper surface of the metal portion and insulating the first electrode portion and the metal portion from each other, and a second insulating portion arranged over the third upper surface of the metal portion and insulating the second electrode portion and the metal portion from each other, and
   the wiring region of each of the one or more light-emitting devices includes a first wiring portion bonded to one of the first electrode portion and the second electrode portion of the wiring substrate and a second wiring portion bonded to the other of the first electrode portion and the second electrode portion of the wiring substrate.

4. The light-emitting module according to claim 3, wherein
the one or more light-emitting devices include a first light-emitting device and a second light-emitting device,
the first light-emitting device and the second light-emitting device are electrically connected in series,
each of the first electrode portion and the second electrode portion of the wiring substrate includes a first electrode region bonded to the first light-emitting device and a second electrode region bonded to the second light-emitting device,
the first electrode region of the first electrode portion is bonded to the first wiring portion of the first light-emitting device,
the second electrode region of the first electrode portion is bonded to the second wiring portion of the second light-emitting device, and
the second electrode portion of the wiring substrate is present midway in a current path from the first wiring portion of the first light-emitting device to the second wiring portion of the second light-emitting device.

5. The light-emitting module according to claim 4, wherein
the first electrode region of the second electrode portion is bonded to the second wiring portion of the first light-emitting device,
the second electrode region of the second electrode portion is bonded to the first wiring portion of the second light-emitting device,
in the wiring substrate, the first electrode region and the second electrode region of the first electrode portion are not electrically connected to each other, and the first electrode region and the second electrode region of the second electrode portion are electrically connected to each other, and
the first electrode region and the second electrode region of the first electrode portion are electrically connected to each other via the first light-emitting device and the second light-emitting device mounted on the wiring substrate.

6. The light-emitting module according to claim 3, wherein
the insulating portion includes a first insulating member arranged on the second upper surface and the third upper surface of the metal portion, and a second insulating member arranged over the first insulating member and defining the third region.

7. The light-emitting module according to claim 3, wherein
in the metal portion, the first upper surface is arranged between the second upper surface and the third upper surface in a top view, and the second upper surface and the third upper surface are separated from each other.

8. The light-emitting module according to claim 1, wherein
the package of each of the one or more light-emitting devices further includes a heat dissipation region in a lower surface of the package, the heat dissipation region being bonded to the metal portion of the wiring substrate.

9. The light-emitting module according to claim 1, further comprising:
a heat sink on which the wiring substrate is disposed; and
one or more fixing members that are respectively inserted into the one or more first through holes to fix the wiring substrate to the heat sink.

10. A method of manufacturing a wiring substrate including a metal portion, an electrode portion, and an insulating portion, the method comprising:
preparing a metal member including a first portion having a first surface and a second portion having a second surface located at a lower position than the first surface, the metal member defining a through hole with a boundary of the through hole being defined by the first surface in a top view;
providing a first insulating member and an electrode member over the second surface so that the metal member and the electrode member are separated from each other in the top view; and
providing a second insulating member between the metal member and the electrode member.

11. The method of manufacturing the wiring substrate, according to claim 10, wherein
the preparing of the metal member includes preparing the metal member further including a third portion having a third surface located at a lower position than the first surface, the first surface being arranged between the second surface and the third surface in the top view, and
the providing of the first insulating member and the electrode member includes providing the first insulating member and the electrode member over the second surface and over the third surface.

12. A method of manufacturing a light-emitting module, the method comprising:
providing the wiring substrate manufactured by the method of manufacturing the wiring substrate according to claim 10;
preparing a light-emitting device including a plurality of light-emitting elements and a package including an upper surface provided with the plurality of light-emitting elements and a lower surface provided with a wiring region; and
mounting the light-emitting device on the wiring substrate by bonding the wiring region to the electrode portion of the wiring substrate.

13. A method of manufacturing the light-emitting module, the method comprising:
providing of the wiring substrate manufactured by the method of manufacturing the wiring substrate according to claim 11;
preparing a light-emitting device including a plurality of light-emitting elements and a package including an upper surface provided with the plurality of light-emitting elements and a lower surface provided with a wiring region and a heat dissipation region; and
mounting the light-emitting device on the wiring substrate by
bonding the heat dissipation region of the package of the light-emitting device to the metal portion of the wiring substrate, and
bonding the wiring region of the package of the light-emitting device to the electrode portion of the wiring substrate provided over the second surface and to the electrode portion provided over the third surface.

* * * * *